United States Patent
Moffatt

(10) Patent No.: US 12,143,083 B2
(45) Date of Patent: Nov. 12, 2024

(54) CONTINUOUSLY VARIABLE ACTIVE REACTANCE SYSTEMS AND METHODS

(71) Applicant: Etherdyne Technologies, Inc., Palo Alto, CA (US)

(72) Inventor: Robert A. Moffatt, Palo Alto, CA (US)

(73) Assignee: Etherdyne Technologies, Inc., Santa Clara, CA (US)

(*) Notice: Subject to any disclaimer, the term of this patent is extended or adjusted under 35 U.S.C. 154(b) by 69 days.

(21) Appl. No.: 18/043,111

(22) PCT Filed: Aug. 26, 2021

(86) PCT No.: PCT/US2021/047734
§ 371 (c)(1),
(2) Date: Feb. 27, 2023

(87) PCT Pub. No.: WO2022/047018
PCT Pub. Date: Mar. 3, 2022

(65) Prior Publication Data
US 2023/0327650 A1    Oct. 12, 2023

Related U.S. Application Data

(60) Provisional application No. 63/071,048, filed on Aug. 27, 2020.

(51) Int. Cl.
*H03H 11/02*    (2006.01)
*H02J 50/12*    (2016.01)

(52) U.S. Cl.
CPC ............. *H03H 11/02* (2013.01); *H02J 50/12* (2016.02)

(58) Field of Classification Search
CPC .................................. H03H 11/02; H02J 50/12
See application file for complete search history.

(56) References Cited

U.S. PATENT DOCUMENTS 10,389,159 B2    8/2019  Lahti et al.
10,651,689 B2    5/2020  Karnstedt et al.
(Continued)

FOREIGN PATENT DOCUMENTS

TW    201216587 A    4/2012
TW    201737609 A    10/2017

OTHER PUBLICATIONS

W. J. Gu and K. Harada, "A New Method to Regulate Resonant Converters," IEEE Trans. Power Electron., vol. 3, No. 4, pp. 430-439, Oct. 1988.

(Continued)

*Primary Examiner* — Jared Fureman
*Assistant Examiner* — Duc M Pham
(74) *Attorney, Agent, or Firm* — Perilla Knox & Hildebrandt LLP; Kenneth A. Knox

(57) ABSTRACT

Various embodiments for controlling a resonant frequency of a resonator are described. A system includes at least one resonant circuit and an active variable reactance circuit that controls a resonant frequency of the at least one resonant circuit. The active variable reactance circuit includes an electrically-controllable switching element and a switch controller sub-circuit configured to switch the electrically-controllable switching element at a frequency of a radio-frequency (RF) current or voltage passing through or across a device such that the RF current flowing from a first terminal to a second terminal is substantially sinusoidal.

23 Claims, 22 Drawing Sheets

(56) References Cited

U.S. PATENT DOCUMENTS

| | | |
|---|---|---|
| 10,892,649 B2 | 1/2021 | Moffatt |
| 10,950,383 B2 | 3/2021 | Moffatt |
| 11,133,715 B2 | 9/2021 | Moffatt et al. |
| 11,362,543 B2 | 6/2022 | Moffatt et al. |
| 2006/0113970 A1 | 6/2006 | Stover et al. |
| 2016/0072306 A1 | 3/2016 | Tsuda et al. |
| 2017/0229921 A1 | 8/2017 | Hwang et al. |
| 2018/0053598 A1 | 2/2018 | Long et al. |
| 2018/0323654 A1 | 11/2018 | Kurs et al. |
| 2018/0375380 A1 | 12/2018 | Liu et al. |
| 2019/0140639 A1 | 5/2019 | Mao et al. |
| 2019/0165614 A1 | 5/2019 | Afridi et al. |
| 2020/0006987 A1 | 1/2020 | Moffatt et al. |
| 2020/0059198 A1 | 2/2020 | Ahmadi |
| 2020/0067350 A1 | 2/2020 | Moffatt |
| 2020/0195043 A1 | 6/2020 | Khurram et al. |
| 2020/0212718 A1 | 7/2020 | Moffatt et al. |
| 2020/0244236 A1 | 7/2020 | Hwang et al. |
| 2021/0234534 A1* | 7/2021 | Rochford ................ H02J 50/12 |
| 2021/0384763 A1 | 12/2021 | Moffatt |
| 2022/0094205 A1* | 3/2022 | Moffatt .................... H04B 5/24 |

OTHER PUBLICATIONS

International Search Report for International Application No. PCT/US2021/047734 mailed Mar. 3, 2022.
Written Opinion for International Application No. PCT/US2021/047734 mailed Mar. 3, 2022.
First Office Action for Taiwan Patent Application No. 110131799 mailed Aug. 19, 2022.

\* cited by examiner

FIG. 17

CONTINUOUSLY VARIABLE ACTIVE REACTANCE SYSTEMS AND METHODS

CROSS-REFERENCE TO RELATED APPLICATIONS

This application is a national stage entry pursuant to 35 U.S.C. § 371 of international application no. PCT/US2021/047734, filed on Aug. 26, 2021, entitled "CONTINUOUSLY VARIABLE ACTIVE REACTANCE SYSTEMS AND METHODS," which claims the benefit of and priority to U.S. Provisional Patent Application No. 63/071,048 entitled "CONTINUOUSLY VARIABLE ACTIVE REACTANCE SYSTEMS AND METHODS," filed Aug. 27, 2020, the contents of both of which being incorporated by reference in their entireties herein.

BACKGROUND

Resonant wireless power systems make use of magnetic or electric coupling between LC resonators in order to transfer electric power. The efficiency of such systems is dependent on the quality factors of the resonators, with higher quality factors resulting in higher wireless power transfer efficiency. However, resonators with higher quality factor have a narrower resonant response curve, meaning the driving frequency must be closer to the resonant frequency of the resonators in order for the potential efficiency gains afforded by higher quality factor to be fully realized. Therefore, in systems where the driving frequency is fixed and/or where two or more resonators are present, precise control over the resonant frequencies of all the resonators is essential for optimizing system performance.

BRIEF DESCRIPTION OF THE DRAWINGS

Many aspects of the present disclosure can be better understood with reference to the following drawings. The components in the drawings are not necessarily to scale, with emphasis instead being placed upon clearly illustrating the principles of the disclosure. Moreover, in the drawings, like reference numerals designate corresponding parts throughout the several views.

FIG. 17 is a schematic block diagram of a circuit for automatic RF current regulation of an LC resonator by way of an active variable capacitance according to various embodiments of the present disclosure.

DETAILED DESCRIPTION

The present disclosure relates to systems and methods for continuously variable active reactance. As noted above, in systems where the driving frequency is fixed and/or where two or more resonators are present, precise control over the resonant frequencies of all the resonators is essential for optimizing system performance. Detuning of the resonators may be caused by a variety of factors, such as variation in component values or interactions with the environment. For this reason, it is desirable to have a way of controlling the resonant frequency of a resonator to correct tuning errors.

Figure 1A:
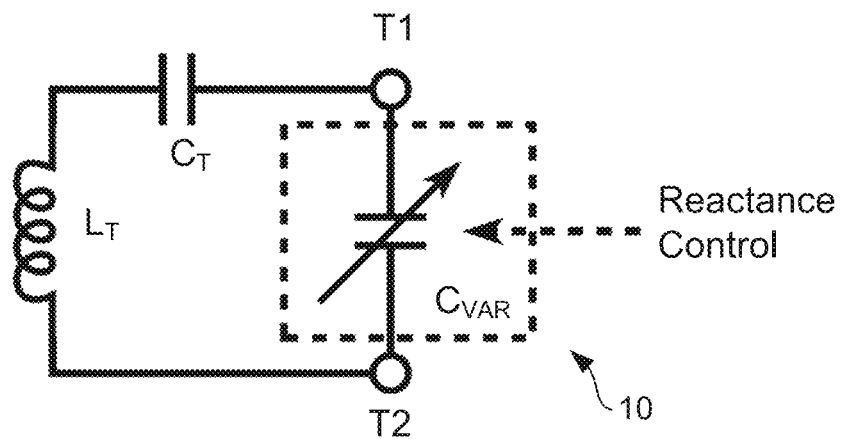
FIG. 1A is an example of a simplified schematic of an LC resonator with an electrically-controlled variable capacitance according to various embodiments of the present disclosure.
Figure 1B:
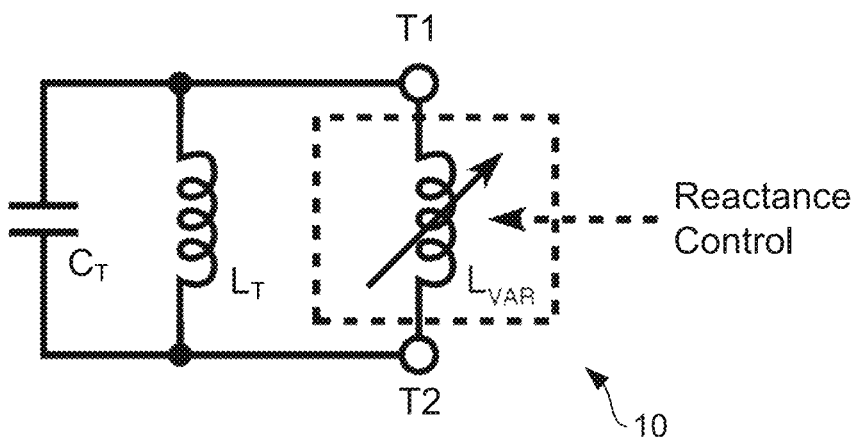
FIG. 1B is another example of a simplified schematic of an LC resonator with an electrically-controlled variable inductance according to various embodiments of the present disclosure.

Referring now to the drawings, FIGS. 1A and 1B show two example embodiments for controlling resonant frequency of an LC resonator. In both examples, a resonant LC tank circuit 10 comprises an inductor $L_T$ and a capacitor $C_T$. Referring to FIG. 1A, a variable capacitance $C_{VAR}$ is in series with $C_T$, which allows the total series capacitance of the LC resonator to be varied. The resonant frequency of the resonator in FIG. 1A is given by the equation:

$$f_{res} = \frac{1}{2\pi\sqrt{L_T C_{series}}}, \quad \text{(eq. 1)}$$

where the total series capacitance, $C_{series}$, is given by:

$$C_{series} = \frac{1}{\frac{1}{C_T} + \frac{1}{C_{VAR}}}. \quad \text{(eq. 2)}$$

In FIG. 1B, a variable inductance $L_{VAR}$ is in parallel with $L_T$, which allows the total parallel inductance of the LC resonator to be varied. The resonant frequency of the resonator in FIG. 1B is given by the equation:

$$f_{res} = \frac{1}{2\pi\sqrt{L_{parallel} C_T}}, \quad \text{(eq. 3)}$$

where the total parallel inductance, $L_{parallel}$, is given by:

$$L_{parallel} = \frac{1}{\frac{1}{L_T} + \frac{1}{L_{VAR}}}. \quad \text{(eq. 4)}$$

In order for the LC resonators shown in FIGS. 1A and 1B to be able to respond to changes in their environment without human control, the variable reactance elements may be electrically-controllable. Electrically-controllable reactances can be made using electromechanical systems, non-linear devices, or discretely switched arrays of inductors or capacitors. However, these approaches all have disadvantages for wireless power applications. Electromechanical systems and discretely switched reactance arrays have high cost and complexity, while non-linear devices require DC control voltages and currents which are much larger than the RF voltage and current amplitudes in the LC tank circuit 10, which is often an impractical requirement for high-power systems. It can be therefore desirable to find a means of constructing an electrically-controllable reactive element which does not require an electro-mechanical device or a non-linear reactance, and which can achieve a continuous tuning range using a minimal number of switching devices and minimal complexity.

One way of achieving electrical control including using an electrical motor to adjust the tuning of a variable capacitor or inductor. However, these electro-mechanical solutions are often bulky and complex. Another possible way to achieve electrical control would include using a non-linear reactive element, such as a varactor or a saturable ferrite. However, these non-linear devices require DC control voltages or currents much larger than the amplitude of the RF current or voltage passing through or across the device in order to behave as a variable reactance. This condition is easy to satisfy when the LC resonator is being used to resonate with weak signals, such as in a radio receiver tank circuit. However, this condition is often difficult or impossible to satisfy when the LC resonator is part of a high-power wireless power system in which the amplitudes of the RF voltages and currents in the resonator are already fairly large. Another way, which maintains linearity, but which does not require electro-mechanical components, is to use electrically-controlled switches, such as metal-oxide-semiconductor field-effect transistor (MOSFETs), bipolar junction transistors (BJTs), relays, etc., to switch reactive components in and out of the LC resonator.

Each state of the switches provides a single tuning state. Therefore, the number of possible states will be equal to two raised to the number of switches. However, this approach has various disadvantages. First, only certain, discrete tuning frequencies are achievable. It is not possible to tune over a continuous range. Second, the system requires more switches and, therefore, becomes more complex as more tuning states are added. Third, the system requires digital control which also adds to its complexity. Therefore, it is desirable to provide an electrically-controllable reactive element which does not require an electro-mechanical device or a non-linear reactance that can achieve a continuous tuning range using a minimal number of switching devices and minimal complexity.

Figure 2A:
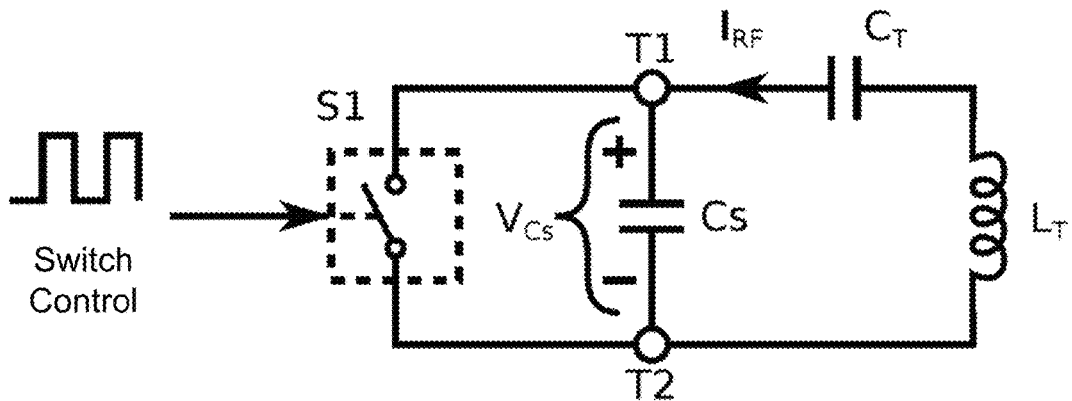
FIG. 2A is an example of a simplified circuit diagram for providing an active variable capacitance according to various embodiments of the present disclosure.
Figure 2B:
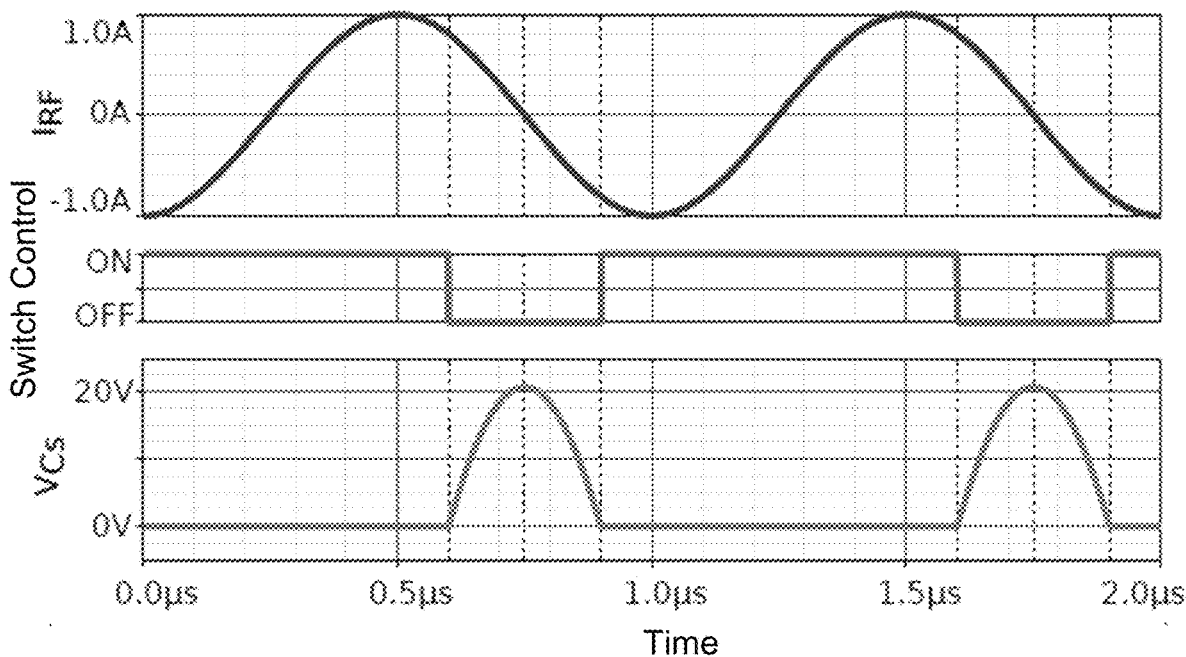
FIG. 2B is a simulate ideal waveform diagram of the simplified circuit diagram of FIG. 2A according to various embodiments of the present disclosure.

The desirable attributes described above may be achieved with active variable reactance. Accordingly, FIGS. 2A and 2B show example circuits where active variable reactances may be constructed using a single electrically-controllable switching device S1 switched on and off at the frequency of the sinusoidal RF current or voltage in the LC tank circuit 10. The LC tank circuit 10 may be powered indirectly through inductive or capacitive coupling to an external RF source with a drive frequency fd, for example.

Figure 3A:
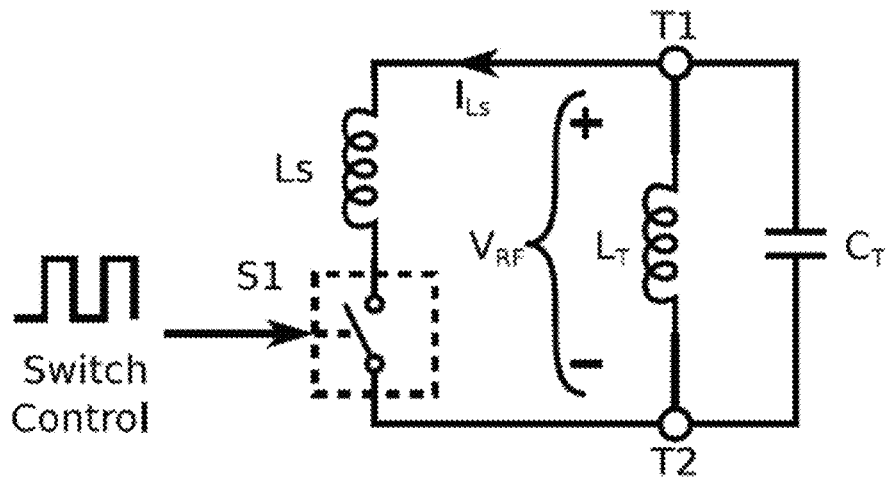
FIG. 3A is an example of a simplified circuit diagram for providing an active variable capacitance according to various embodiments of the present disclosure.

The tuning of the resonators shown in FIGS. 2A and 3A may be adjusted by changing the duty cycle of the switch. Using this single, electrically-controlled switching device, these circuits can produce variable reactance without the complexity of the electromechanical systems or switched arrays and without the need for the large DC voltages or currents required by the non-linear systems.

Figure 4A:
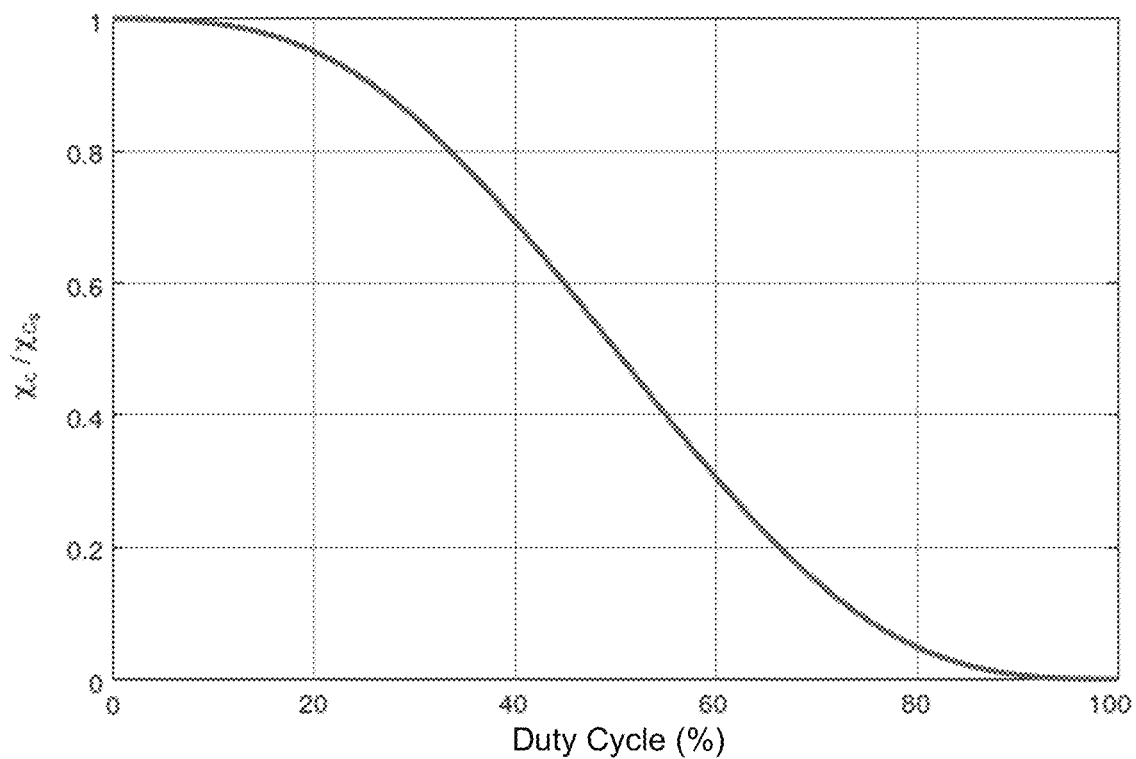
FIG. 4A is a chart showing an effective capacitive reactance versus duty cycle according to various embodiments of the present disclosure.

In the active variable capacitance shown in FIG. 2A, the LC tank circuit 10 ensures that the RF current $I_{RF}$, flowing from terminal $T_1$ to terminal $T_2$, is nearly sinusoidal. This RF current $I_{RF}$ is shown in the top plot of FIG. 2B. The middle plot shows the switch control square wave. The phase of the square wave is chosen such that the negative-slope zero-crossing of RF current $I_{RF}$ occurs at the midpoint of the low period. The bottom plot shows the voltage $V_{Cs}$, across capacitor $C_s$, where it is assumed that $C_s \gg C_T$. When the switch is off, the capacitor $C_s$, is first charged and then discharged by the current $I_{RF}$. The phase relation between $I_{RF}$ and the Switch Control square wave guarantees zero-voltage switching, ensuring that the switch does not dissipate energy by discharging $C_s$ when it turns on. The voltage waveform, $V_{Cs}(t)$ contains many harmonics. However, the LC tank circuit 10 acts as a filter which responds primarily to the fundamental. Therefore, an effective reactance $x_c$ may be defined by dividing the amplitude of this fundamental by the amplitude of the RF current:

$$x_c = x_{C_s}\left(\frac{\sin(2\pi d)}{2\pi} - \delta + 1\right),\qquad\text{(eq. 5)}$$

where $x_{C_s} \equiv 1/(\omega C_s)$ is the reactance of capacitor $C_s$ at the angular frequency $\omega$ of the RF current. Eq. 5 shows that the effective reactance may be continually varied by changing the switch duty cycle $\delta$. The relation between the duty cycle and the effective capacitive reactance is plotted in FIG. 4A. This reactance is equivalent to the following effective variable capacitance:

$$C_{VAR} = \frac{1}{\omega x_c} = \frac{C_s}{\frac{\sin(2\pi\delta)}{2\pi} - \delta + 1}.\qquad\text{(eq. 6)}$$

Figure 3B:
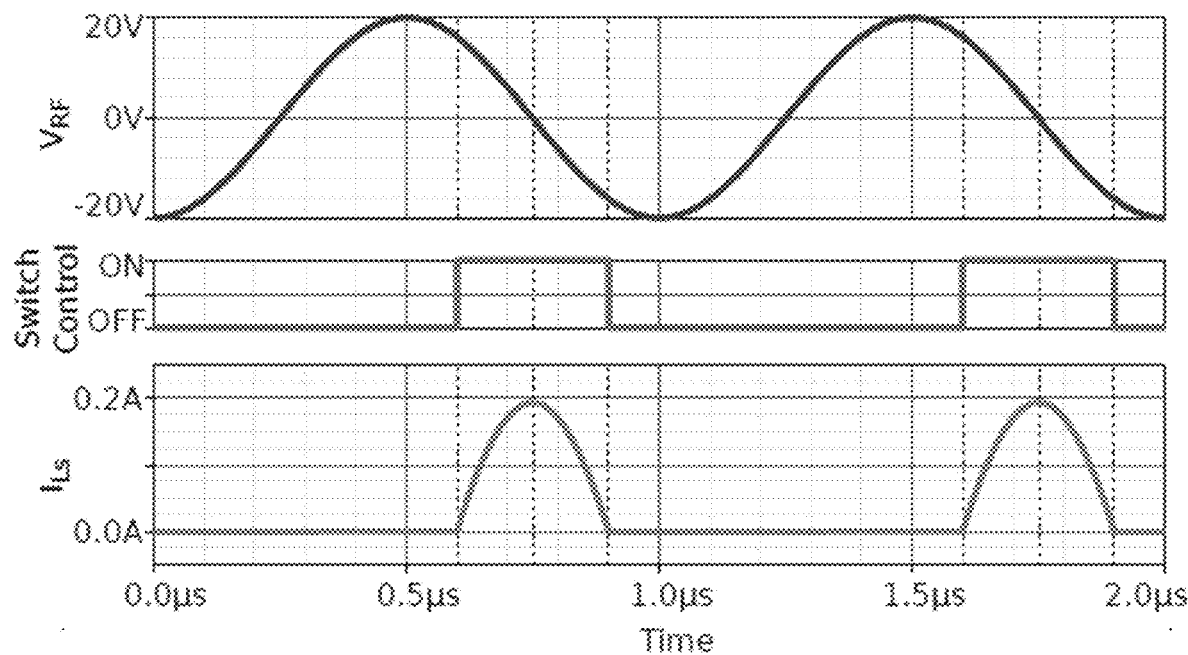
FIG. 3B is a simulate ideal waveform diagram of the simplified circuit diagram of FIG. 3A according to various embodiments of the present disclosure.
Figure 4B:
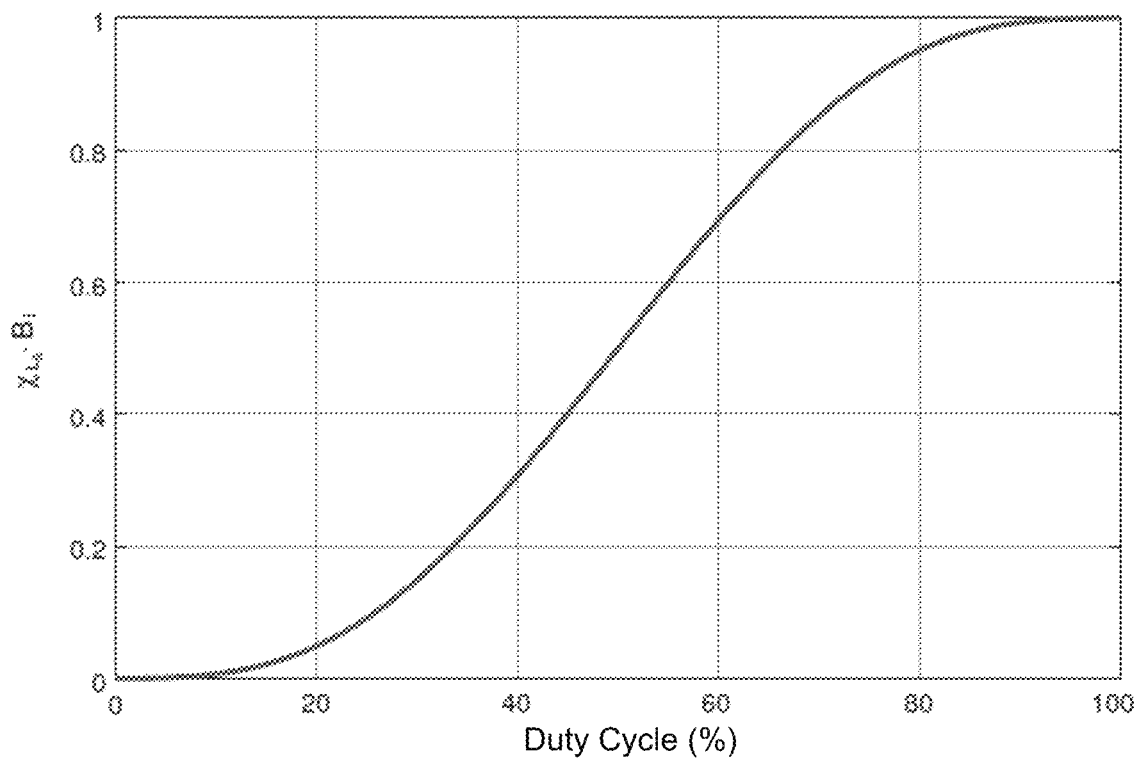
FIG. 4B is a chart showing an effective inductive susceptance versus duty cycle according to various embodiments of the present disclosure.

In the active variable inductance shown in FIG. 3A, the LC tank circuit 10 ensures that the RF voltage $V_{RF}$ between terminal $T_1$ and terminal $T_2$ is nearly sinusoidal. This RF voltage is shown in the top plot of FIG. 3B. The middle plot shows the switch control square wave. The phase of the square wave is chosen such that the negative-slope zero-crossing of RF voltage $V_{RF}$ occurs at the midpoint of the high period. The bottom plot shows the current, $I_{Ls}$, through inductor $L_s$, where it is assumed that $L_s \gg L_T$. When the switch is on, the voltage $V_{RF}$ causes the inductor current to first rise and then fall. The phase relation between $V_{RF}$ and the switch control square wave guarantees zero-current switching, ensuring that the switch does not dissipate energy. The current waveform $I_{Ls}(t)$, contains many harmonics. However, the LC tank circuit 10 acts as a filter which responds primarily to the fundamental. Therefore, an effective susceptance $B_l$ may be defined by dividing the amplitude of this fundamental by the amplitude of the RF voltage:

$$B_l = \frac{1}{xL_s}\left(\delta - \frac{\sin(2\pi d)}{2\pi}\right),\qquad\text{(eq. 7)}$$

where $xL_s \equiv \omega L_s$ is the reactance of inductor $L_s$ at the angular frequency $\omega$ of the RF voltage. Eq. 7 shows that the effective susceptance may be continually varied by changing the switch duty cycle $\delta$. The relation between the duty cycle and the effective inductive susceptance is plotted in FIG. 4B. The effective inductive reactance is equal to the reciprocal of the effective inductive susceptance:

$$Xl = \frac{1}{B_l} = \frac{xL_s}{\delta - \frac{\sin(2\pi d)}{\delta}}.\qquad\text{(eq. 8)}$$

This reactance is equivalent to the following effective variable inductance:

$$L_{VAR} = \frac{Xl}{\omega} = \frac{L_s}{\delta - \frac{\sin(2\pi d)}{2\pi}}.\qquad\text{(eq. 9)}$$

Figure 5:
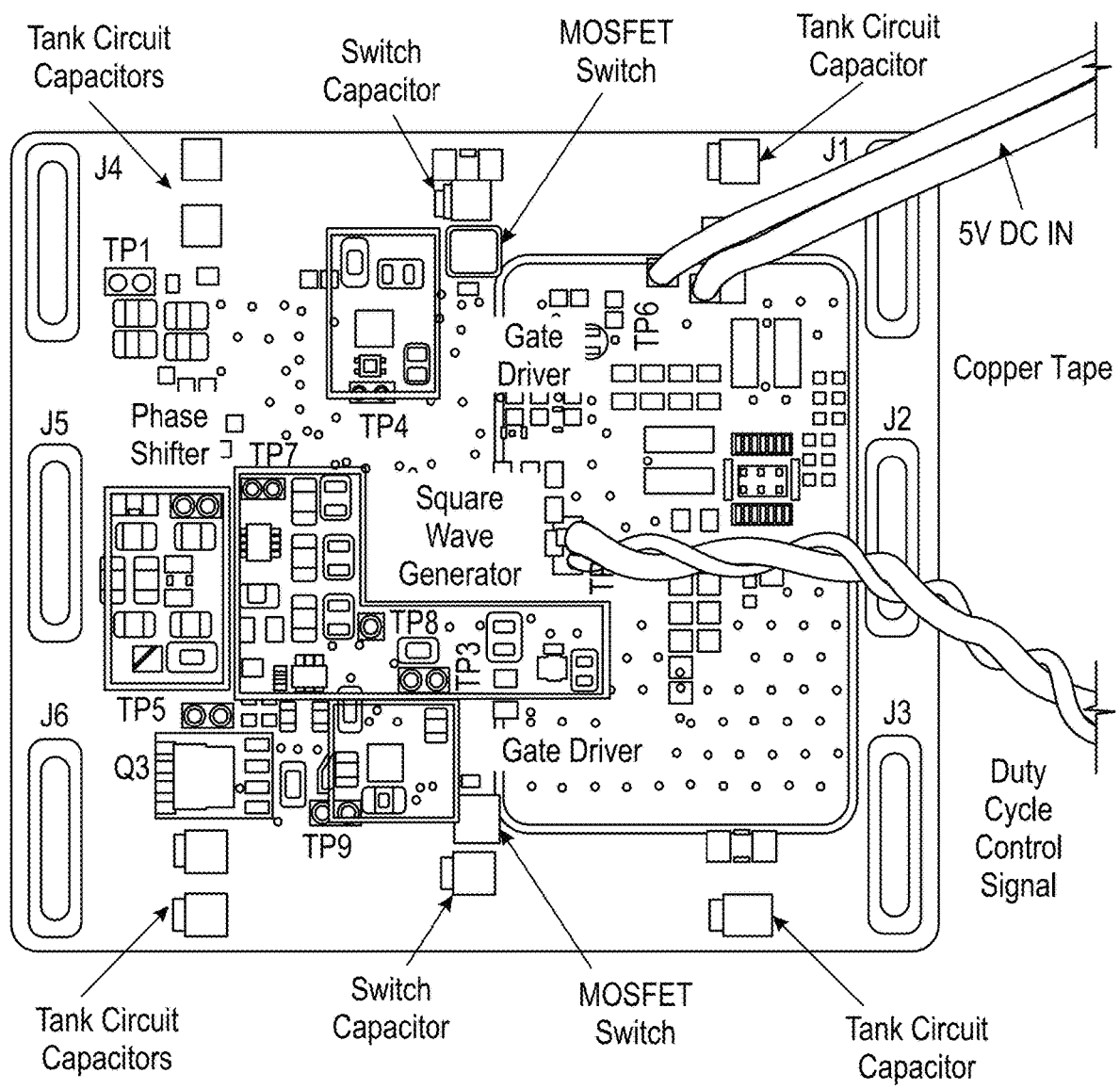
FIG. 5 is a photograph of a printed circuit board (PCB) implementing an active variable capacitance circuit used for collecting measurements shown in FIGS. 6 and 7 according to various embodiments of the present disclosure.

FIG. 5 shows an active variable capacitance circuit that was soldered to an inductive loop made from copper tape, although other materials may be employed. The loop was inductively driven by an external RF source. The switch was implemented with a parallel pair of MOSFETs. To generate the gate-drive signal, the sinusoidal voltage across a capacitor in series with the loop was sent through a phase shift network and into a comparator to generate a square wave, which was then converted into a triangle wave by an RC filter and fed into a second comparator to produce a square wave with controllable duty cycle.

Figure 6:
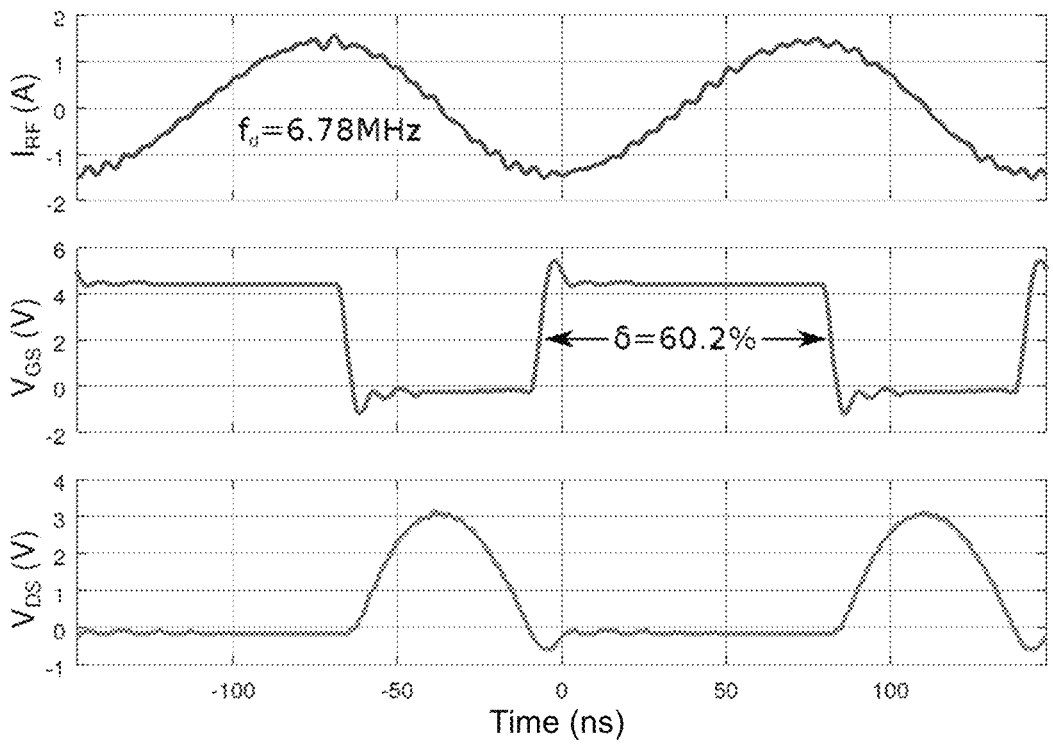
FIG. 6 is a chart showing measured waveforms of the active variable capacitance of the circuit of FIG. 5 according to various embodiments of the present disclosure.

FIG. 6 shows measurements of the gate, drain, and RF current waveforms, which are in good agreement with the shapes of the ideal waveforms shown in FIG. 2B. More specifically, in FIG. 5, measured waveforms of the active variable capacitance circuit in FIG. 5 are shown. Current $I_{RF}$ was determined from the time derivative of the voltage across a series capacitor. A 200 MHz low-pass filter was applied in software to remove high-frequency noise amplified by the derivative.

Figure 7:
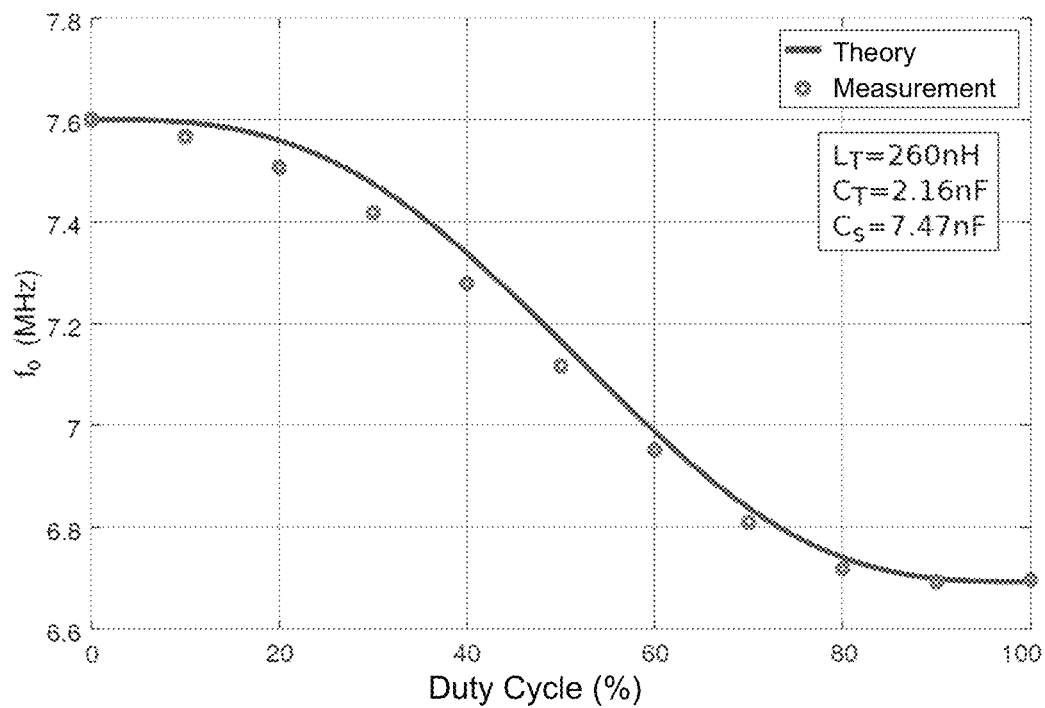
FIG. 7 is a chart showing a measured resonant frequency versus a duty cycle of a resonator containing the active variable capacitance circuit of FIG. 5 according to various embodiments of the present disclosure.

To test the validity of eq. 6, the resonator was inductively coupled to a driven loop. The gate-drive duty cycle was varied, and for each value of the duty cycle, the resonant frequency was measured by finding the drive frequency at which the RF current in the resonator was maximized. The results are plotted in FIG. 7 and show fairly good agreement with the prediction of eq. 6. Specifically, FIG. 7 shows a measured resonant frequency versus a duty cycle of a resonator containing the active variable capacitance circuit shown in FIG. 5.

Figure 8:
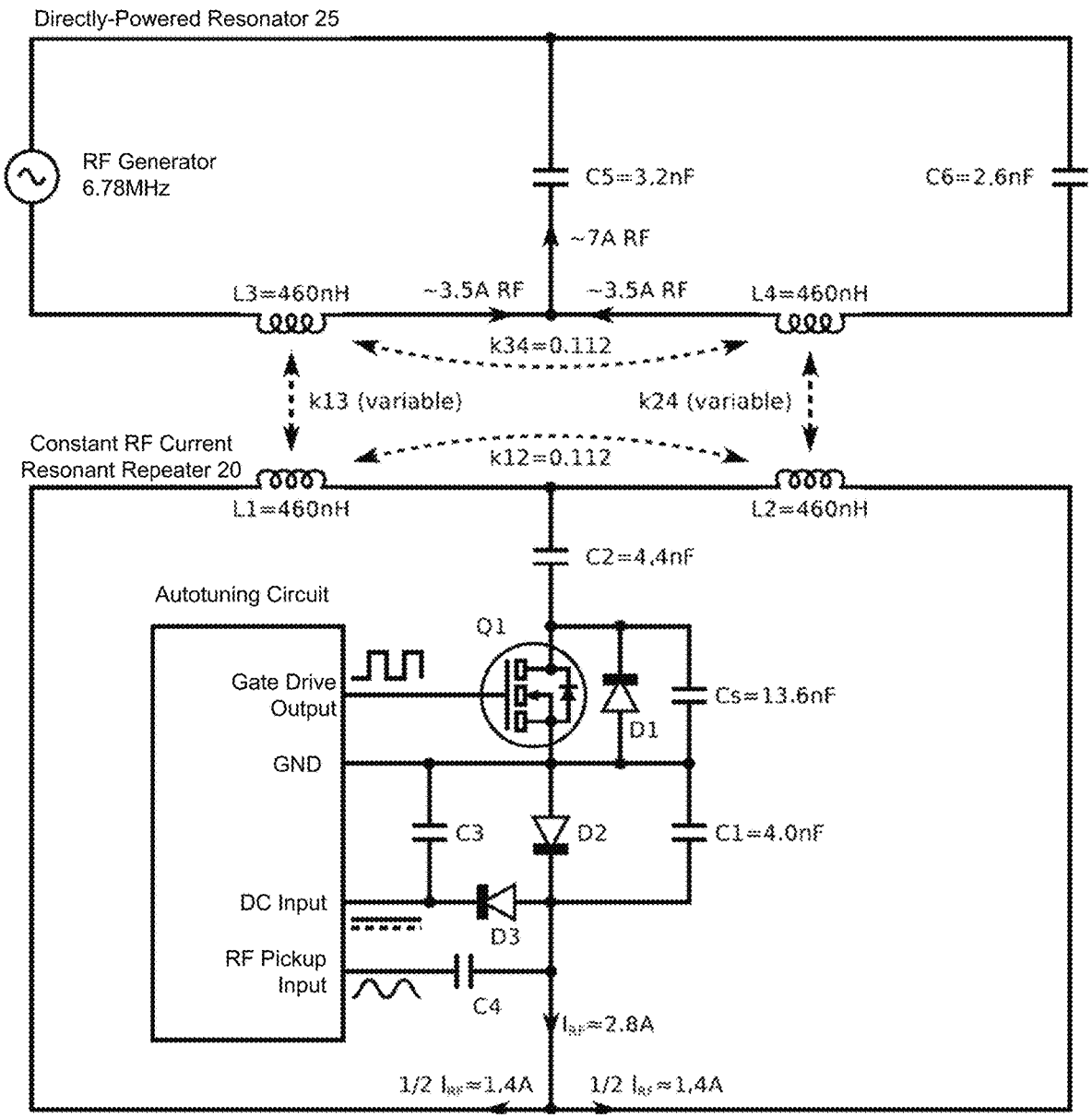
FIG. 8 is an example of a simplified schematic of autotuning repeater resonator according to various embodiments of the present disclosure.
Figure 9:
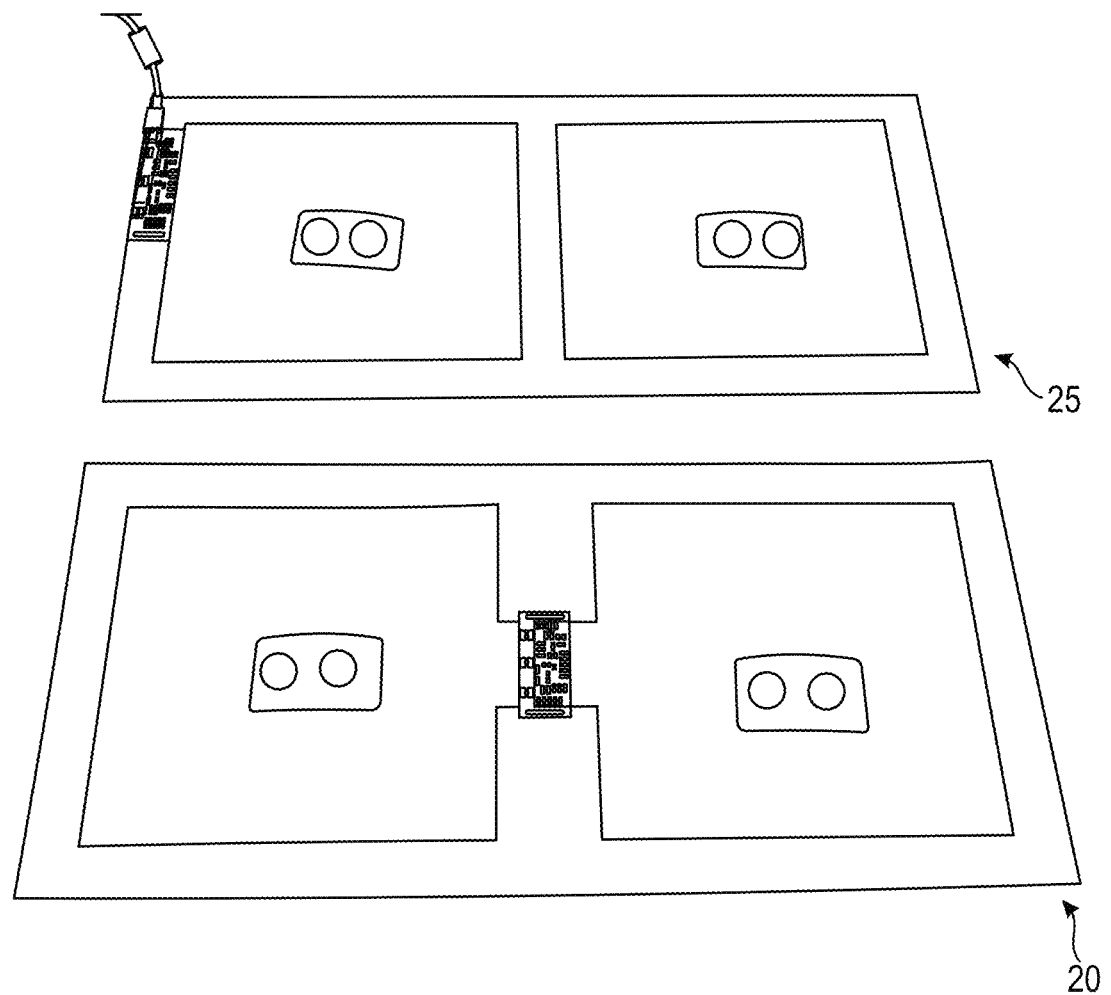
FIG. 9 is a photograph of an autotuning repeater resonator and a directly-driven resonator according to various embodiments of the present disclosure.

The ability to electrically control the tuning of an LC resonator has many uses in resonant wireless power transfer. One example is the system shown in FIG. 8 in which an active variable capacitance is used in combination with a feedback circuit to maintain a constant RF current amplitude in a wireless repeater resonator. A constant RF current resonant repeater 20 (e.g., the lower resonator in the schematic of FIG. 8 and the photograph of FIG. 9) is inductively coupled to a directly-powered resonator 25 (upper resonator in the schematic of FIG. 8 and the photograph of FIG. 9), driven at 6.78 MHz. Each resonator measures approximately 25 cm×50 cm. The resonant repeater 20 automatically adjusts its tuning to maintain a constant RF current amplitude $I_{RF}$. The direct and repeater resonators are each powering two regulated wireless 360 mW LED loads (e.g., the LED lights shown in FIG. 9). Note that inductors $L_1$ and $L_2$ have equal current amplitude, with opposite directions of circulation. In the directly-powered resonator, the capacitors $C_5$ and $C_6$ are chosen such that $L_3$ and $L_4$ also have equal RF current amplitude, with opposite directions of circulation.

The capacitors Cs, C1, and C2 can be selected such that, for any duty cycle of the active variable capacitance, the resonant frequency of the repeater resonator is always higher than the drive frequency produced by an RF Generator. This implies that the RF current amplitude is a monotonic function of the duty cycle. The autotuning circuit measures the rectified DC voltage across $C_3$, which is proportional to the RF current amplitude $I_{RF}$ in the resonant repeater 20. A feedback loop may be provided that regulates the duty cycle of the gate-drive square wave in order to keep this rectified DC voltage constant. As a result, this feedback loop automatically changes the tuning of the repeater resonator such that the RF current amplitude $I_{RF}$ remains constant, even as the inductive coupling k13 and k24 is changed by moving the repeater resonator relative to the directly-powered resonator. The system shown in FIG. 8 was able to keep the RF current amplitude in the repeater resonator within ±1% of 2.83 A as the separation between the direct and repeater resonators was varied from 2.0 cm to 5.5 cm.

The active variable capacitance and active variable inductance circuits shown in FIGS. 2A and 3A, respectively, allow the resonant frequency of an LC resonator to be electrically controlled over a continuous range, at high RF power levels, with low cost and complexity, using a single switching device. The electrical control of resonance has many uses in resonant wireless power transfer. One example shown herein includes the automatic regulation of the RF current amplitude in a repeater resonator via a feedback loop controlling an active variable capacitance. Other potential applications include making wireless transmitters or receivers less sensitive to component variations, or environmental perturbations.

Figure 10:
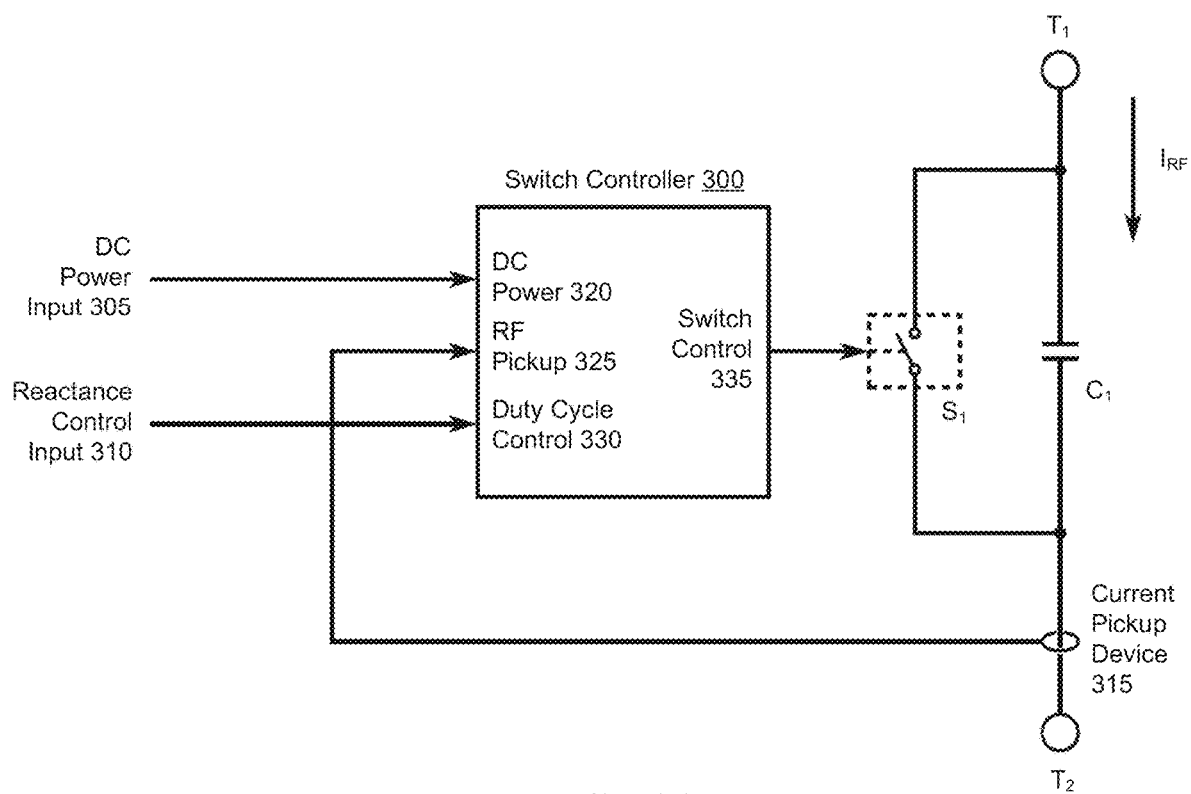
FIG. 10 is a schematic block diagram of a system for active variable capacitive reactance according to various embodiments of the present disclosure.
Figure 11:
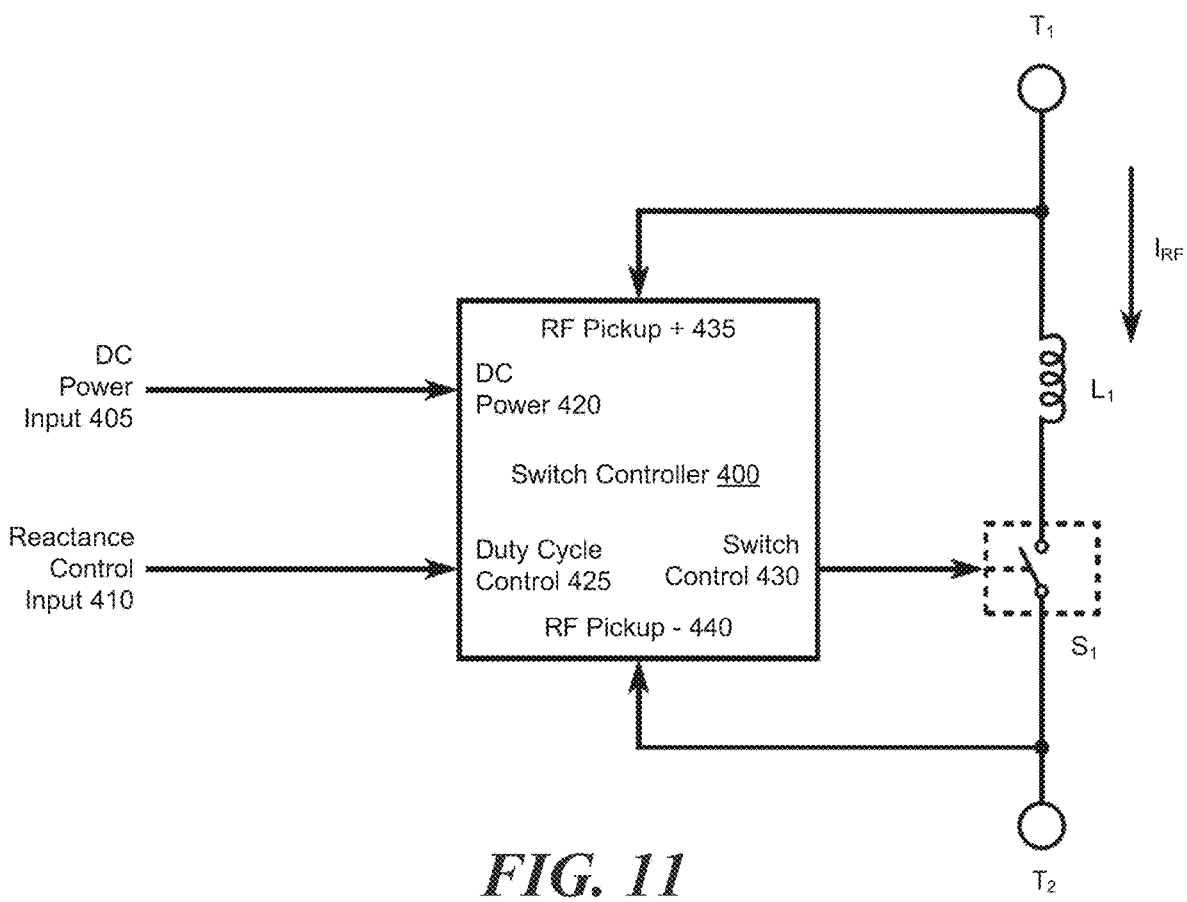
FIG. 11 is a schematic block diagram of a system for active variable inductive reactance according to various embodiments of the present disclosure.

FIGS. 10 and 11 show example embodiments for how electrically-controllable linear variable reactances may be constructed using an electrically-controllable switching element $S_1$ that is switched on and off at the frequency of the RF current or voltage passing through or across the device. FIG. 10 includes a switch controller 300, a DC power input 305, a reactance control input 310, an electrically-controllable switching element $S_1$, a terminal $T_1$, a terminal $T_2$, a capacitor $C_1$, and a current pickup device 315. The switch controller 300 includes a DC power input 320, an RF pickup input 325, a duty cycle control input 330, and a switch control output 335. The electrically-controllable switching element $S_1$ may be any sort of electrically-controllable switching device, such as a MOSFET, a BJT, a pair of MOSFETs arranged as a bidirectional switch, etc. FIG. 10 shows an example embodiment of a variable capacitive reactance that can be placed in series with an LC resonator as shown in FIG. 1A, and FIG. 11 shows an example embodiment of a variable inductive reactance that can be placed in parallel with an LC resonator, as shown in FIG. 1B.

Note that, in some cases, it may be desirable to place multiple sets of parallel capacitors and switches or series inductors and switches in parallel, e.g., with all sets sharing the same two terminals and with all switches sharing a same switch control signal. This may be useful, for example, in cases where the active variable reactance is part of a resonator composed of conductors which are large compared to the physical sizes of the inductors, capacitors, and/or switches. Multiple inductors, capacitors, and/or switches may therefore be used such that the distribution of current through all of the parallel devices matches the intrinsic current distribution in the large conductor.

Similar to FIG. 10, FIG. 11 includes a switch controller 400, a DC power input 405, a reactance control input 410, an electrically-controllable switching element $S_1$, a terminal $T_1$ a terminal $T_2$, and an inductor $L_1$. The switch controller 400 includes a DC power input 420, a duty cycle control input 425, and a switch control output 430. The switch controller 400 may further include a positive RF pickup input 435 and a negative RF pickup input 440.

When the device shown in FIG. 10 is placed in series with an LC resonator, the LC resonator ensures that the RF current $I_{RF}$ flowing from terminal $T_1$ to terminal $T_2$ is nearly sinusoidal. The current pickup component generates a voltage proportional to this RF current. This pickup may consist of a transformer, a series resistance or reactance, or any device which produces a signal proportional to the RF current flowing through the LC resonator to which the active variable reactance circuit is attached. The switch controller 300 may include a switch controller sub-circuit. In some examples, the switch controller 300 may take an RF Pickup sine wave as input and generate a square wave output with a variable duty cycle. The duty cycle may be controlled by the reactance control input 310. The phase of the square wave is chosen such that it leads $I_{RF}$ by 90 degrees. In other words, the negative-slope zero-crossing of $I_{RF}$ occurs at the mid-point of the time period where the square wave is in its low state.

The square wave output drives the switching element $S_1$. The switch is on when the square wave is in its high state, and off when the square wave is in its low state. When the device shown in FIG. 11 is placed in parallel with an LC resonator, the LC resonator ensures that the RF voltage $V_{RF}$, between terminal $T_1$ and terminal $T_2$, is nearly sinusoidal.

The switch controller sub-circuit takes the RF voltage $V_{RF}$ as an input and generates a square wave output with a variable duty cycle. Note that, in general, the RF pickup need not necessarily come from the two terminals $T_1$ and $T_2$, but can come from any device attached to the LC resonator which produces a signal proportional to the RF voltage across the LC resonator to which the active variable reactance circuit is attached. The duty cycle is controlled by the reactance control input signal. The phase of the square wave is chosen such that it lags $V_{RF}$ by 90 degrees. In other words, the negative-slope zero-crossing of $V_{RF}$ occurs at the mid-point of the time period where the square wave is in its high state. The square wave output drives the switching element $S_1$. The switch is on when the square wave is in its high state, and off when the square wave is in its low state.

Figure 12:
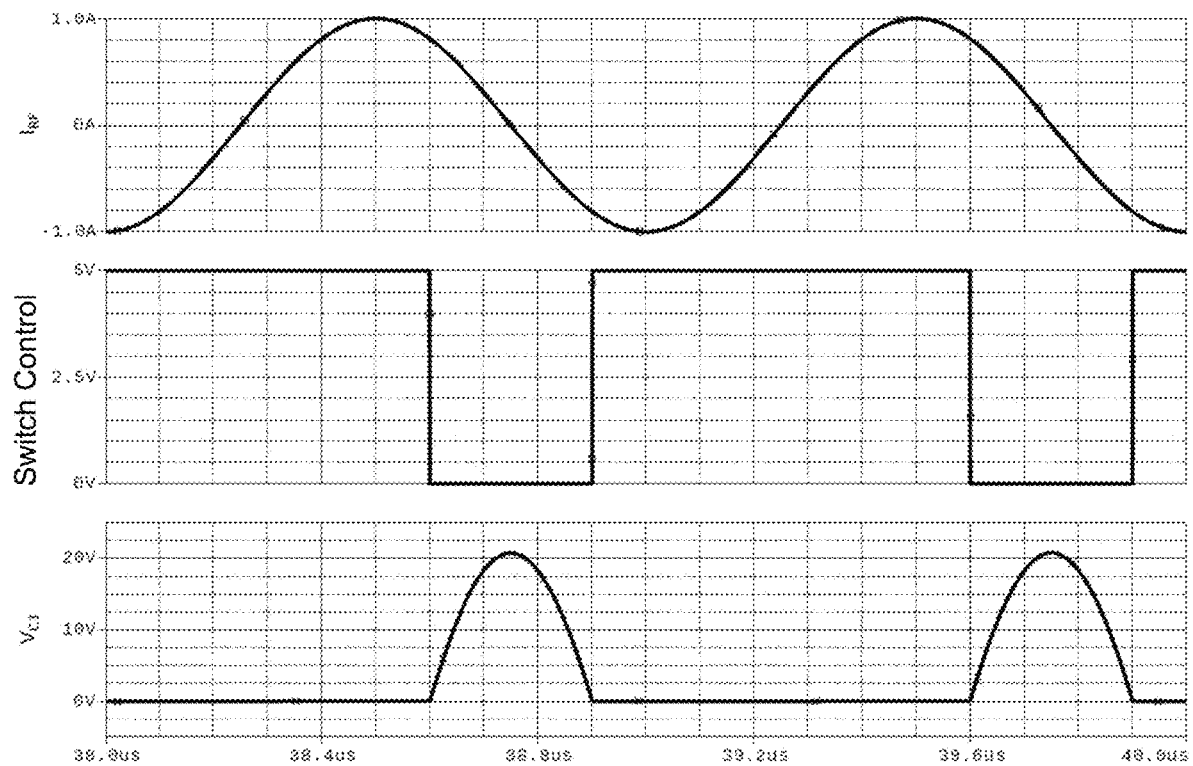
FIG. 12 is a chart showing simulated results of ideal voltage and current waveforms of the active variable capacitance.

FIG. 12 illustrates how a variation of the duty cycle of the switch control square wave varies the effective capacitive reactance between terminals $T_1$ and $T_2$ in the circuit shown in FIG. 10. The sinusoidal current $I_{RF}$ is shown in the top plot. The middle plot shows the switch control square wave. Note that the negative-slope zero-crossing of $I_{RF}$ occurs at the midpoint of the low period of the switch control square wave. The bottom plot shows the voltage, $V_{C1}$, across capacitor, $C_1$. When the switch $S_1$ is on, $V_{C1}$ is zero. When the switch is off, the current $I_{RF}$ charges the capacitor $C_1$, causing its voltage to rise. The voltage reaches a peak when $I_{RF}$ is zero. As $I_{RF}$ becomes negative, $V_{C1}$ begins to fall. When $V_{C1}$ reaches zero, the switch turns on again. Note that the phase relation between $I_{RF}$ and the switch control square wave guarantees that the switch turns on when $V_{C1}$ is zero. This zero-voltage switching condition is necessary to ensure that the switch $S_1$ does not dissipate energy by discharging $C_1$ when it turns on.

During the time period when the switch is off, $V_{C1}(t)$ is equal to a sine wave plus a DC offset. The amplitude of the sine wave component is equal to the amplitude of $I_{RF}$ multiplied by the reactance of $C_1$. The full waveform $V_{C1}(t)$ may be decomposed into a Fourier series. The LC resonator acts as a filter, and primarily responds to the Fourier component closest to its resonant frequency. Therefore, the behavior of the tunable LC resonator may be analyzed by examining only the fundamental component of this Fourier series. By dividing voltage amplitude of this fundamental component by the amplitude of $I_{RF}$, we arrive at the effective capacitive reactance, $X_{eff}$, as a function of the duty cycle $\delta$:

$$X_{eff} = X_{C_1}\left(\frac{\sin(2\pi\delta)}{2\pi} - \delta + 1\right), \quad \text{(eq. 10)}$$

where $X_{C_1}$ is the reactance of capacitor $$X_{C_1} \equiv \frac{1}{\omega C_1}, \quad \text{(eq. 11)}$$

where $\omega$ is the angular frequency of the RF current, $I_{RF}$. The relation between the duty cycle and the effective capacitive reactance is plotted in FIG. 13. Note that by changing the duty cycle $\delta$, the effective reactance may be continually varied over the range of 0 to $X_{C_1}$.

We may define the effective capacitance, $C_{VAR}$, as follows:

$$C_{VAR} \equiv \frac{1}{\omega X_{eff}}, \quad \text{(eq. 12)}$$

Therefore, the effective variable capacitance is:

$$C_{VAR} = \frac{C_1}{\frac{\sin(2\pi\delta)}{2\pi} - \delta + 1}. \quad \text{(eq. 13)}$$

Figure 14:
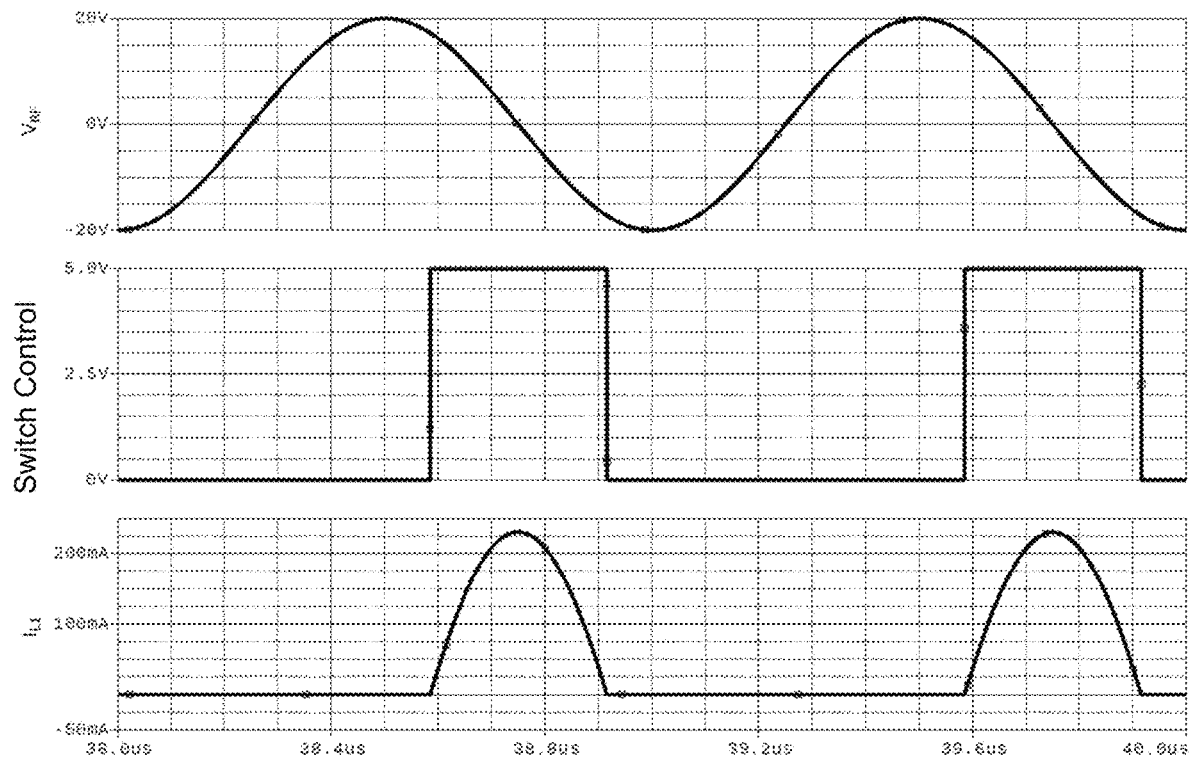
FIG. 14 is a graph showing simulation of ideal voltage and current waveforms of the active variable inductance.

FIG. 14 illustrates how a variation of the duty cycle of the switch control square wave varies the effective inductive reactance between terminals $T_1$ and $T_2$ in the circuit shown in FIG. 11. The sinusoidal voltage, $V_{RF}=V_{T_1}-V_{T_2}$, is shown in the top plot. The middle plot shows the switch control square wave. Note that the negative-slope zero-crossing of $V_{RF}$ occurs at the midpoint of the high period of the switch control square wave. The bottom plot shows the current $I_{L1}$ through inductor $L_1$. When the switch $S_1$ is off, $I_{L1}$ is zero. When the switch is on, the voltage $V_{RF}$ causes the current in the inductor $L_1$ to increase. The current reaches a peak when $V_{RF}$ is zero. As $V_{RF}$ becomes negative, $I_{L1}$ begins to fall. When $I_{L1}$ reaches zero, the switch turns off again. Note that the phase relation between $V_{RF}$ and the switch control square wave guarantees that the switch turns off when $I_{L1}$ is zero. This zero-current switching condition is necessary to ensure that the switch $S_1$ does not dissipate energy from inductive kickback by turning off when $I_{L1}$ not zero.

Figure 15:
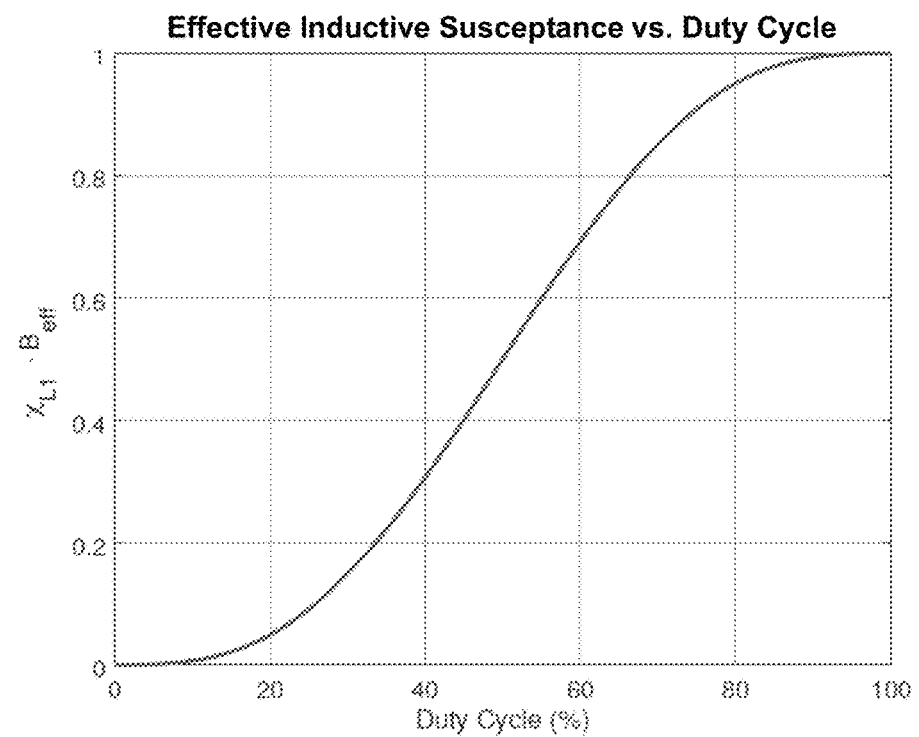
FIG. 15 is a graph showing effective inductive susceptance as a function of duty cycle.

During the time period when the switch is on, $I_{L1}(t)$ is equal to a sine wave plus a DC offset. The amplitude of the sine wave component is equal to the amplitude of $V_{RF}$ divided by the reactance of $L_1$. The full waveform $I_{L1}(t)$ may be decomposed into a Fourier series. The LC resonator acts as a filter, and primarily responds to the Fourier component closest to its resonant frequency. Therefore, the behavior of the tunable LC resonator may be analyzed by examining only the fundamental component of this Fourier series. By dividing the current amplitude of this fundamental component by the amplitude of $V_{RF}$, we arrive at the effective inductive susceptance, $B_{eff}$, as a function of the duty cycle $\delta$:

$$B_{eff} = \frac{1}{X_{L_1}}\left(\delta - \frac{\sin(2\pi\delta)}{2\pi}\right), \quad \text{(eq. 14)}$$

where $X_{L_1}$ is the reactance of inductor $L_1$:

$$X_{L_1} = \omega L_1 \quad \text{(eq. 15)},$$

where $\omega$ is the angular frequency of the RF voltage $V_{RF}$. The relation between the duty cycle and the effective inductive susceptance is plotted in FIG. 15. Note that by changing the duty cycle $\delta$, the effective susceptance may be continually varied over the range of 0 to $1/X_{L_1}$.

The effective inductive reactance is equal to the reciprocal of the effective inductive susceptance:

$$X_{eff} = \frac{1}{B_{eff}} = \frac{X_{L_1}}{\delta - \frac{\sin(2\pi\delta)}{\delta}}. \quad \text{(eq. 16)}$$

We may define the effective inductance, $L_{VAR}$, as follows:

$$L_{VAR} \equiv \frac{X_{eff}}{\omega}. \quad \text{(eq. 17)}$$

Therefore, the effective variable inductance is:

$$L_{VAR} = \frac{L_1}{\delta - \frac{\sin(2\pi\delta)}{\delta}}. \quad \text{(eq. 18)}$$

Note that the sources of the RF Pickup shown in FIGS. 10 and 11 are merely one example of how the proper frequency and phase of the switch control square wave may be generated. In general, the RF Pickup can come from any source of RF in the LC resonator. For example, the RF Pickup may come from the RF voltage across an impedance in series with the LC resonator, or from the RF current though an admittance in parallel with the LC resonator, or from inductive or capacitive coupling to the LC resonator. Any of these methods may be used, so long as the proper phase relations are maintained between the switch control square wave and the voltages and currents in the LC resonator, namely, that the switch control square wave leads the current through terminals $T_1$ and $T_2$ by 90 degrees in the variable capacitive reactance circuit, and the switch control square wave lags the voltage across terminals $T_1$ and $T_2$ by 90 degrees in the variable inductive reactance circuit.

The switch control sub-circuits in the variable capacitive reactance and the variable inductive reactance circuits may require DC power in order to function. If the variable active reactance device is part of a system which has an external supply of power, the switch control sub-circuit may receive power from this external power source. However, in some cases, it is desirable for the LC resonator to be powered without any connection to an external DC power supply. For example, the LC resonator may be part of a resonant repeater which receives wireless power from a wireless power source and delivers it to a separate wireless power receiver. In such cases, it would be useful for the switch control sub-circuit to generate DC power from the RF power present in the LC resonator. This may be accomplished in a variety of ways, for example, by rectifying the RF voltage across a reactance in series with the LC resonator, rectifying the voltage across the LC resonator, or rectifying a voltage induced by inductive or capacitive coupling to the LC resonator.

In another example, the active variable reactance may be part of an actively powered LC resonator, but may be located in a position on the resonator where DC power cables cannot be routed without disrupting the tuning of that resonator. In such a case, the active variable reactance may be powered by rectifying the RF present in the LC resonator. Alternatively, the LC resonator may be arranged such that it is capable of supporting both RF and DC current simultaneously. This may be achieved by placing inductive chokes in parallel with capacitive junctions which need to pass DC current, or placing bypass capacitors in series with inductors in junctions which need a DC potential difference. In this way, DC power may be routed to the active variable reactance through the structure of the LC resonator itself, without requiring any additional wiring.

The Reactance Control Input allows the resonant frequency of an LC resonator to be electrically controlled when it incorporates either a capacitive or an inductive active variable reactance. This may be used as part of a feedback loop to regulate the RF current amplitude in the LC resonator when the LC resonator is placed in an external oscillating electric or magnetic field.

In some embodiments, this may be accomplished as follows. First, the tuning range should be chosen such that the resonant frequency of the LC resonator with the active variable reactance device is always greater than or always less than the driving frequency for all duty cycles. In other words, for a given driving frequency, the resonant frequency of the LC resonator does not pass through a point at which the resonant frequency equals the driving frequency at a certain duty cycle. Alternatively, the range of allowed duty cycles could be limited such that the duty cycle is only allowed to vary over a range in which the resonant frequency is always above or always below the driving frequency.

For a fixed driving amplitude and a fixed driving frequency, this guarantees a monotonic relationship between the duty cycle and the amplitude of the RF current in the LC resonator. Second, the amplitude of the RF current in the LC resonator may be compared to a desired set point. This comparison may be accomplished in a variety of ways, such as rectifying the RF voltage across the LC resonator or the RF voltage across an impedance in series with the LC resonator, and comparing the rectified DC voltage to a reference voltage. Third, a feedback circuit may be constructed which increases or decreases the duty cycle of the active variable reactance, i.e. varies the Reactance Control input, in order to reduce the error between the detected RF current amplitude in the LC resonator and the desired RF current amplitude in the LC resonator.

Figure 16:
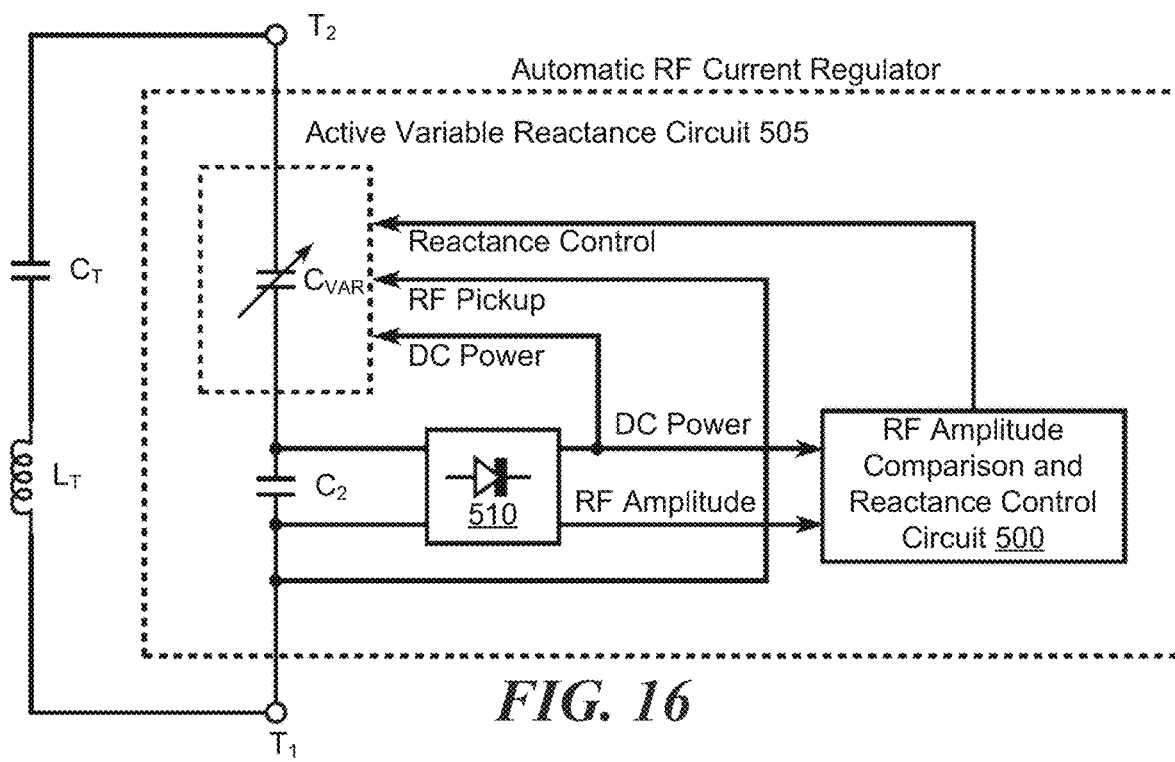
FIG. 16 is a schematic block diagram of a circuit for automatically regulating RF current amplitude of an externally-driven LC resonator using tuning control by way of an active variable reactance according to various embodiments of the present disclosure.

As an example of such a system, consider the block diagram shown in FIG. 16. The system consists of a series LC circuit, formed by $L_T$ and $C_T$, connected to two terminals $T_1$ and $T_2$, of an Automatic RF Current Regulator circuit. The Automatic RF Current Regulator may include an active variable capacitance $C_{VAR}$ in series with a second capacitance $C_2$. The total series capacitance of the full system is given by:

$$C_{series} = \frac{1}{\frac{1}{C_T} + \frac{1}{C_2} + \frac{1}{C_{VAR}}}. \quad \text{(eq. 19)}$$

The angular resonant frequency of the LC resonator is:

$$\omega_{res} = \frac{1}{\sqrt{L_T C_{series}}}. \quad \text{(eq. 20)}$$

If the resonator is driven by an external magnetic field oscillating at angular frequency, $\omega$, the inductor, $L_T$, will experience an induced EMF $V_{ind}$. The total series reactance, $X_{tot}$, of the system is:

$$X_{tot} = \omega L_T - \frac{1}{\omega C_T} - \frac{1}{\omega C_2} - \frac{1}{\omega C_{VAR}} = X_0 + X_{eff}, \quad \text{(eq. 21)}$$

where $X_0$ is a constant given by:

$$X_0 = \omega L_T - \frac{1}{\omega C_T} - \frac{1}{\omega C_2}, \quad \text{(eq. 22)}$$

and where $X_{eff}$ is the effective series reactance of the variable active capacitance element:

$$X_{eff} = \frac{1}{\omega C_{VAR}} = X_{C_1}\left(\frac{\sin(2\pi\delta)}{2\pi} - \delta + 1\right), \quad \text{(eq. 23)}$$

where $X_{C_1}$ is the reactance of the switched capacitor, $C_1$, contained within the active variable capacitance element, and where $\delta$ is the duty cycle of the active variable capacitance element. Here, it will be assumed that $X_0 > 0$. This implies that $X_{tot} > 0$ for all values of $\delta$. When the LC resonator has low loss, the RF current amplitude, may be approximated as:

$$|I_{RF}| \approx \frac{V_{ind}}{X_{tot}} = \frac{V_{ind}}{X_0 + X_{eff}}. \quad \text{(eq. 24)}$$

Therefore, we can see that the tuning condition, $X_0 > 0$, ensures that the RF current amplitude, $|I_{RF}|$, is a monotonic function of $X_{eff}$, which is a monotonic function of $\delta$.

In the system shown in FIG. 16, a rectifier generates a DC signal which is proportional to the RF Current flowing through the LC resonator. This signal is compared to a set point by an RF amplitude comparison and reactance control circuit 500. The error between the RF amplitude signal to the internal set point is amplified and used to generate the reactance control signal, which is sent to an active variable reactance circuit 505. Because the RF amplitude DC signal is a monotonic function of the RF current amplitude, and the RF current amplitude is a monotonic function of the reactance control signal, an overall gain factor may be chosen for the full feedback loop such that the full loop has negative feedback. In general, the sign of this gain factor will depend on whether the monotonic functions have positive or negative slope.

Note also that, in addition to the RF amplitude output, a rectifier sub-circuit 510 provides a second DC Power output, which provides DC Power to the active variable reactance circuit 505 and the RF amplitude comparison and reactance control circuit 505. This DC power may be regulated such that its voltage is independent of the RF current amplitude of the LC resonator. Note also that the series capacitor $C_2$ provides a convenient source of RF voltage which is proportional to the RF current amplitude in the LC resonator. The voltage across capacitor $C_2$ is therefore used as the RF pickup input to the active variable reactance sub-circuit 505.

Figure 17:
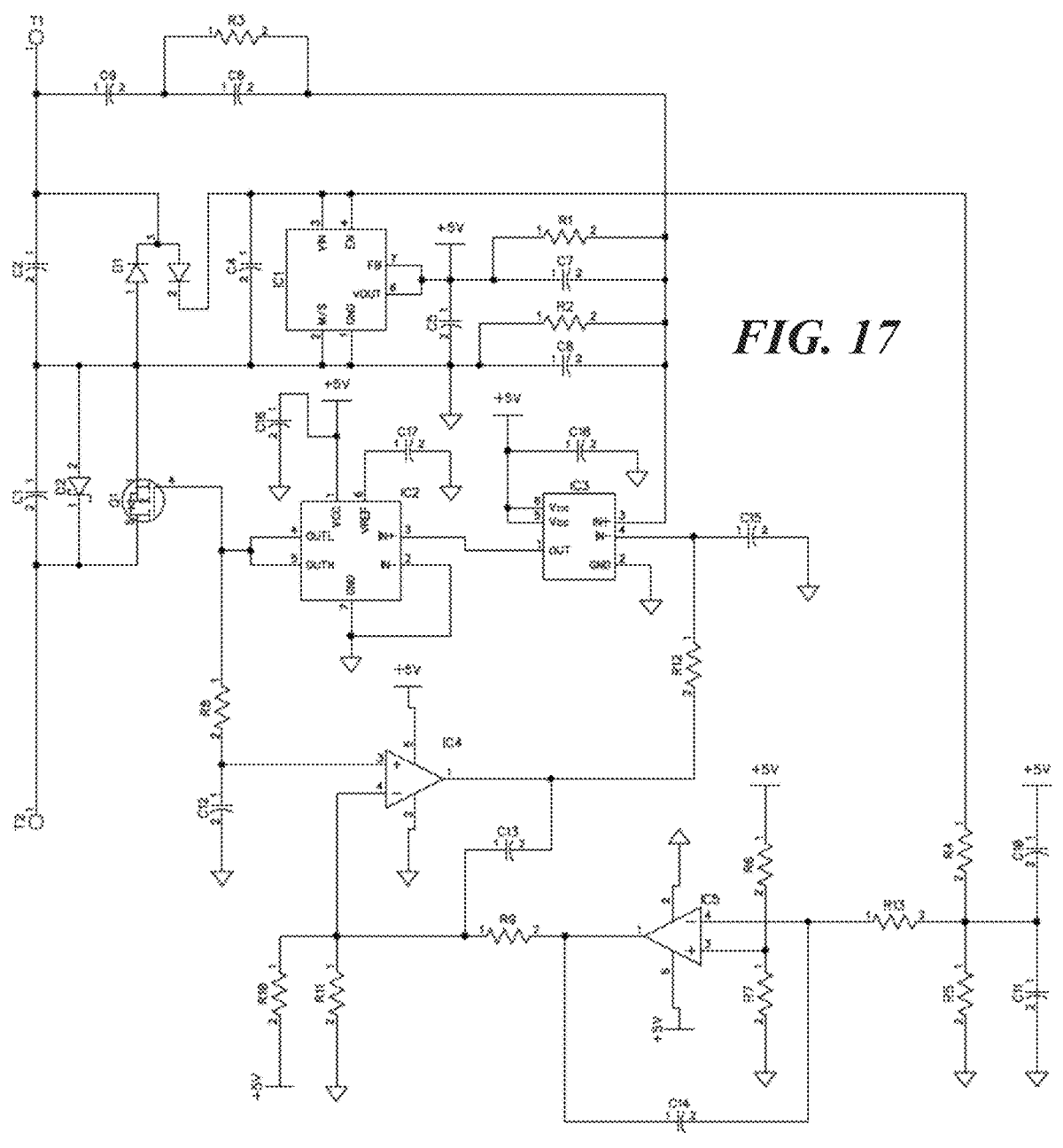

An example of an active variable reactance for automatic RF current regulation is shown in FIG. 17. The circuit may be a part of an LC resonator. A series inductance and capacitance is connected between terminals $T_1$ and $T_2$. This inductance and series capacitance, along with capacitors $C_1$ and $C_2$, form an LC resonator. An external RF power source induces a voltage in the inductance. The circuit rectifies the RF voltage across capacitor $C_2$ to provide a DC input to DC-to-DC converter $IC_1$. $IC_1$ provides 5 VDC to the rest of the circuit.

The RF sine wave on capacitor $C_2$ is filtered and fed into the input of comparator $IC_3$, which generates a square wave output. The duty cycle of the square wave is determined by the voltage on the inverting input of $IC_3$.

The square wave output of $IC_3$ goes to the gate driver $IC_2$, which drives the gate of MOSFET $Q_1$. Resistors $R_1$, $R_2$, and $R_3$, and capacitors $C_6$, $C_7$, and $C_8$, are chosen to shift the phase of the sine wave at the non-inverting input of $IC_3$ such that the square wave on the gate of $Q_1$ leads the RF current, $I_{RF}$, owing from terminal $T_1$ to terminal $T_2$ by 90 degrees. Note that the phase shift induced by $R_1$, $R_2$, $R_3$, $C_6$, $C_7$, and $C_8$ may correct for a phase shift caused by propagation delay through $IC_3$ and $IC_2$.

MOSFET $Q_1$ may be in parallel with capacitor $C_1$. If MOSFET $Q_1$ is on all the time, those capacitors are shorted, and the effective reactance of those capacitors in series with the LC resonator is zero. If MOSFET $Q_2$ is off all the time, the full reactance of $C_1$ is placed in series with the LC resonator. If the duty cycle of MOSFET $Q_1$ is intermediate between 0% and 100%, the effective series reactance of $C_1$ will be between zero and its maximum value. Note that the diode $D_2$ is connected from the source to the drain of MOSFET $Q_1$. This diode is in parallel with the internal body diode of $Q_1$, and has the same polarity. It may be chosen to have a lower forward voltage drop than the body diode of $Q_1$, and therefore prevent conduction through the body diode of $Q_1$. This is beneficial in cases where the body diode of $Q_1$ has a reverse recovery time which is long compared to the period of the RF. In such a case, a diode $D_2$ may be chosen such that its reverse recovery time is much shorter than this period.

The diode $D_2$, ensures that the drain-to-source voltage of $Q_1$ never becomes more negative than the forward voltage drop of $D_2$. This ensures that no current is conducted through the body diode of $Q_1$ when $Q_1$ is off. The diode $D_2$ causes a DC charge to be present on capacitor $C_1$. Note that when the internal body diode of $Q_1$ has a sufficiently fast reverse recovery time, the diode $D_2$ may not be necessary. In such a case, the internal body diode of $Q_1$ plays the role of $D_2$. The duty cycle of $Q_1$ is set by a feedback loop involving Op-Amp $IC_4$. Resistor $R_8$ and capacitor $C_{12}$ filter the gate drive square wave and produce a DC voltage which is proportional to the duty cycle. This voltage is fed to the non-inverting input of $IC_4$. The output of $IC_4$ goes through a low-pass filter formed by $R_{12}$ and $C_{15}$ to the inverting input of $IC_3$.

The voltage at the inverting input of $IC_3$ sets the duty cycle of its output square wave. The feedback loop involving $IC_4$ will change the duty cycle of that square wave until the voltage at the inverting input of $IC_4$ is equal to the voltage of the non-inverting input of $IC_4$. Therefore, the duty cycle of the gate-drive square wave will be equal to the DC voltage of the inverting input of $IC_4$ divided by 5 V.

The voltage of the inverting input of $IC_4$ is set by a second feedback loop involving Op-Amp $IC_5$. The output of $IC_5$ is connected to the inverting input of $IC_4$ through resistor $R_9$. The inverting input of $IC_4$ is also connected to its own output through capacitor $C_{13}$, to ground through $R_{11}$, and to +5 V through $R_{10}$. Because the output voltage of $IC_5$ is limited to be between 0 V and +5 V, resistors $R_9$, $R_{10}$, and $R_{11}$ act as a voltage divider which sets an upper and a lower limit to the DC voltage at the inverting input of $IC_4$. These limits set the upper and lower limits of the duty cycle of the gate-drive square wave, respectively. The capacitor $C_{13}$, in conjunction with $R_9$, $R_{10}$, and $R_{11}$, acts as a low-pass filter. $IC_5$ compares the rectified voltage of $C_4$ to a pre-determined voltage set point, and adjusts its output voltage in order to maintain a constant rectified voltage on $C_4$. This works as follows.

An increase in the output voltage of $IC_5$ causes an increase in the duty cycle of the gate drive square wave. This causes $Q_1$ to be on for a greater fraction of the cycle, which reduces the effective reactance of capacitor $C_1$. The LC resonator is tuned so that its resonant frequency is higher than the driving frequency. Therefore, decreasing the series capacitive reactance will cause its resonant frequency to decrease. This brings it closer to resonating with the driving frequency, which causes the induced RF current amplitude to increase. This increases the RF voltage across capacitor $C_2$, which increases the rectified voltage across capacitor $C_4$. This voltage goes through the low-pass filter and voltage divider formed by $R_4$, $R_5$, $C_{10}$, and $C_{11}$. The filtered voltage goes to the inverting input of $IC_5$ through resistor $R_{13}$. Capacitor $C_{14}$ and resistor $R_{13}$ form an additional low-pass filter. As the DC voltage across capacitor $C_4$ goes up, so does the voltage at the inverting input of $IC_5$, which causes the output voltage of $IC_5$ to decrease, completing the negative feedback loop. Therefore, $IC_5$ maintains a constant RF voltage amplitude across capacitor $C_2$, which implies that it must maintain a constant RF current circulating in the LC resonator.

It should also be noted that the active variable reactances may be coupled to LC resonators in multiple ways. For example, if the LC resonator contains multiple capacitors or multiple inductors in series, an active variable reactance may be placed in parallel with one of these capacitors or inductors. Alternatively, if the LC resonator contains multiple inductors or multiple capacitors in parallel, the active variable reactance may be placed in series with one of these capacitors or inductors. Additionally, the active variable reactance may be inductively or capacitively coupled to the LC resonator.

Note that the LC resonators depicted in FIGS. 1A and 1B are the simplest reactive circuits which incorporate an active variable reactance. In general, the active variable reactance element may be placed in any circuit requiring variable reactance, so long as the circuit filters the voltage harmonics of the variable capacitance or the current harmonics of the variable inductance. An LC resonator naturally accomplishes this filtering, but other, more complex combinations of reactive components may accomplish this filtering as well.

For example, the active variable reactance may be incorporated into a T-filter or a π-filter, or some other more complex filter. Such a filter may be a low-pass, high-pass, band-pass filter, or band-stop filter. The active variable reactance could allow the cutoff frequency or frequencies of the filter to be electrically controlled. Alternatively, the active variable reactance may be used to electrically-control the input or output impedance of the filter in order to achieve electrically-controlled impedance matching.

Another example may be a resonator composed of multiple LC circuits, such as two adjacent LC resonator loops. Such a resonator may have multiple resonant modes. In a resonant wireless power system, the system of coupled resonators will be driven at one of its resonant modes. An active variable reactance can be coupled to one or more of the resonators in order to tune the desired resonant mode of operation such that its eigenfrequency is equal to the frequency of the driving source. Alternatively, the active variable reactance may be used to continuously change the tuning of one or more of the LC circuits in order to change the eigenmode structure of the entire coupled system. While keeping the driving frequency fixed, the system may be retuned such that a particular eigenmode becomes resonant with the driving frequency.

In this way, the relative phases and amplitudes of the voltages and currents throughout the LC structure may be chosen and set by one or more active variable reactances. Also note that one or more fixed inductive or capacitive reactances may be included in series or parallel with the switched reactive elements in the active variable reactance circuits 505. These additional components may be used to block DC voltage, block DC current, add or subtract additional reactance or susceptance, etc. The RF voltage across additional series components, or the current through additional parallel components, may also be used as a source of RF Pickup, or rectified as a source of DC Power. For example, FIG. 17 shows an example of an active variable capacitance which uses an additional capacitor placed in series with a switched capacitor $C_1$. The capacitor $C_2$ provides an RF voltage which is used both for RF Pickup and also rectified to provide DC Power.

Reactance Control Signal. In some cases, the active variable reactance circuit 505 may not share a ground with the control system which generates the Reactance Control input signal. It may also not share a ground with a source of DC power. In such cases, it would be desirable to provide a way of delivering the Reactance Control signal and/or DC power to the active variable reactance circuit 505 without directly connecting the grounds of the two circuits, which may cause an RF short, etc.

In such a case, the Reactance Control input could be provided to the active variable reactance circuit 505 through RF chokes, which pass the DC Reactance Control signal, but block RF. It could be provided through an optocoupler, which could be arranged to transfer analog or digital signals. If digital signals are transferred, then the active variable reactance circuit 505 could have an additional circuit which converts the digital signal into an analog signal which it may use for reactance control. Alternatively, the reactance control signal may also be communicated through fiber optics.

Another method for transferring the Reactance Control signal from the controller to the active variable reactance circuit 505 may be to transmit the signal wirelessly. This wireless transmission may be achieved using either analog or digital communications at a frequency which differs from the frequency of the RF power present in the LC resonator.

Another method may include using the superposition of DC and RF signals in the structure of the circuit to which the Active Variable Reactance is attached. If RF chokes or bypass capacitors are used to isolate the DC voltage across terminals $T_1$ and $T_2$ or the DC current through terminals $T_1$ and $T_2$ from the DC current through the internal inductor $L_1$, or the DC voltage across capacitor $C_1$, the DC voltage across $T_1$ and $T_2$ or DC current though $T_1$ and $T_2$ may controlled by an external source and may be used as the Reactance Control signal of the Active Variable Reactance.

If the Active Variable Reactance is also in need of a source of DC Power, then it may use coupling to, and rectification of, the RF power present in the LC resonator as its source of DC power. Alternatively, a DC voltage across $T_1$ and $T_2$ or a DC current through $T_1$ and $T_2$ may be used as a source of DC Power. For a certain range of DC voltages and/or currents, this externally-applied DC voltage and/or current may be used simultaneously as a source of DC Power and as a source of the Reactance Control signal.

Tuning of an LC Resonator Driven by an RF Generator. In some implementations of resonant wireless power, the source of the power will be an LC resonator driven by a Class-E RF generator which takes in external DC power and converts it to RF power in the LC resonator. This Class-E RF generator may be made to maintain high DC-to-RF efficiency by operating the switching element (typically a MOSFET) in a zero-voltage switching condition. This zero-voltage switching condition may be maintained by varying the duty cycle of the switching element in order to ensure that the switching element turns on at the time when its voltage reaches zero. A feedback system may be incorporated into the Class-E RF generator to adjust the duty cycle in order to maintain the RF generator in this condition.

Such a system is called Automatic Zero-Voltage Switching (AZVS), and it allows the Class-E amplifier to maintain high efficiency even when the LC resonator is detuned over a certain pre-defined range.

Figure 18:
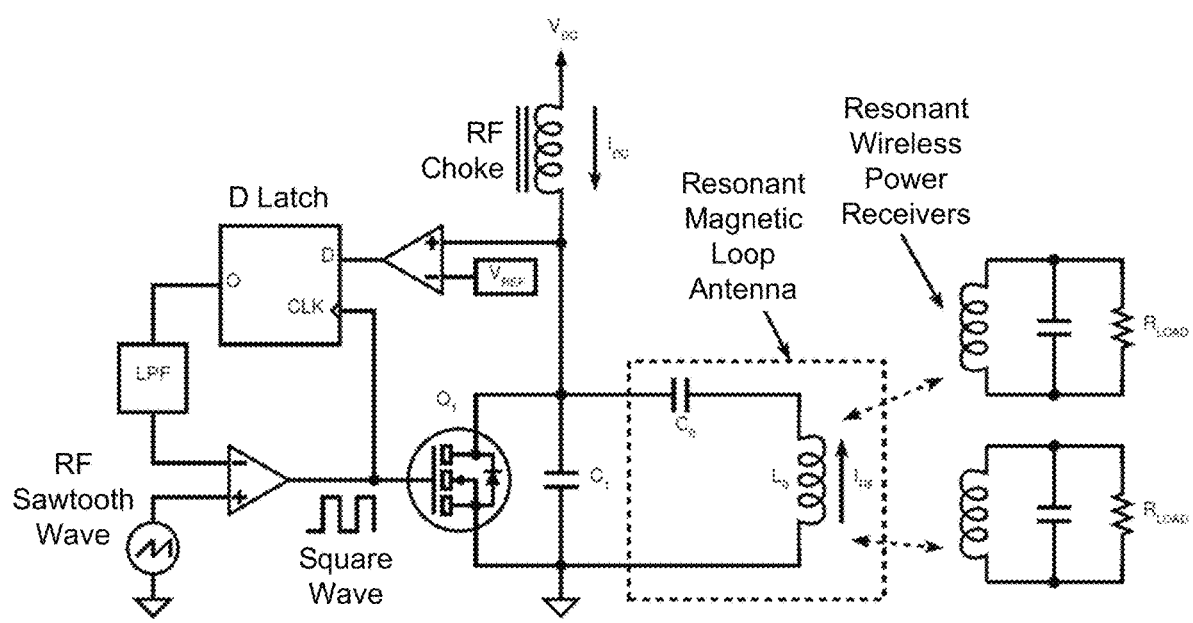
FIG. 18 is a Class-E RF generator with automatic zero-voltage switching according to various embodiments of the present disclosure.

FIG. 18 shows an example of a Class-E RF generator with AZVS. The RF drive frequency, $f_d$, is set by the frequency of the RF sawtooth wave input. A comparator converts the sawtooth wave to a square wave by comparing it to a DC voltage level. The square wave drives the gate of MOSFET $Q_1$. The drain and source of MOSFET $Q_1$ are in parallel with a capacitor C1. The capacitor $C_0$ and the inductor $L_0$ form the LC tank circuit 10 of the Class-E RF generator. Let $f_0$ denote the resonant frequency of the LC tank circuit 10, defined to be:

$$f_0 = \frac{1}{2\pi\sqrt{L_0 C_0}}. \qquad \text{(eq. 25)}$$

The inductor, L0, is a magnetic loop antenna which couples RF power to resonant wireless receivers. DC power is supplied to the circuit through an RF choke connected to the drain of Q1. The system may be characterized by a dimensionless constant, K, defined to be:

$$K \equiv \frac{C_0}{C_0 + C_1} = \frac{X_1}{X_1 + X_0}, \qquad \text{(eq. 26)}$$

and where $X_0=1/(2\pi f_d C_0)$ and $X_1=1/(2\pi f_d C_1)$ are the reactances of $C_0$ and $C_1$ respectively, at the drive frequency, $f_d$.

A second comparator compares the drain voltage of Q1 to a reference voltage, $V_{ref}$, which is close to 0V. A D-latch latches the output of the comparator at the time of the rising edge of the gate-drive square wave. The output of the latch therefore indicates whether the drain voltage of Q1 is above or below $V_{ref}$ at the instant when Q1 turns on. The output of the D-latch is low-pass filtered. If Q1 turns on too early, the output of the D-latch is high, causing the DC output of the low-pass filter to slowly rise, which shifts the rising edge of the gate-drive square wave later in the cycle. If Q1 turns on too late, the output of the D-latch is low, causing the DC output of the low-pass filter to slowly fall, which shifts the rising edge of the gate-drive square wave earlier in the cycle. Therefore, the AZVS feedback circuit controls the duty cycle of the gate-drive square wave such that the drain voltage of Q1 is equal to $V_{ref}$ at the instant when Q1 turns on. If $V_{ref}$ is set very close to 0 V, then the circuit will achieve Zero-Voltage Switching.

It is desirable to maintain a constant RF current in the LC resonator over a variety of both loading and tuning conditions. This constancy can allow receivers to be kept in a constant ambient field regardless of the loading of the loop. It also is desirable in order to prevent the Specific Absorption Rate in nearby human tissue from exceeding regulatory limits due to excursions of the RF current amplitude above the designed operating point.

Figure 19:
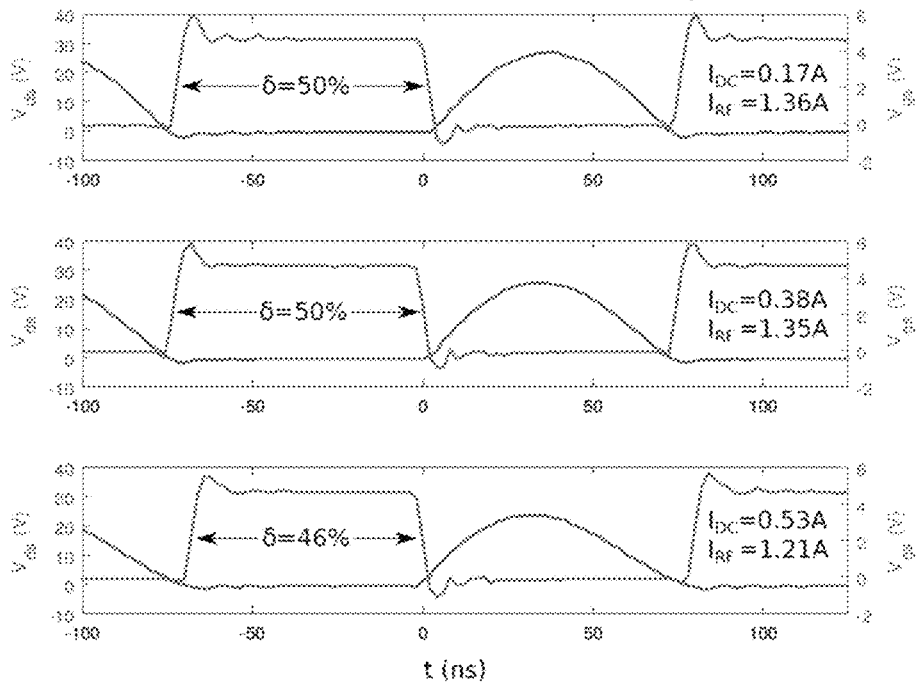
FIG. 19 is a chart showing measured gate and drain voltage waveforms for a Class-E amplifier with automatic zero-voltage switching for various loading conditions according to various embodiments of the present disclosure.

For a given tuning of $f_0$, the AZVS Class-E RF generator will maintain an RF current amplitude in the LC resonator, which is substantially independent of the RF load, so long as the DC current remains much lower than the amplitude of the RF current in the LC resonator. This can be seen in FIG. 19.

Figure 20:
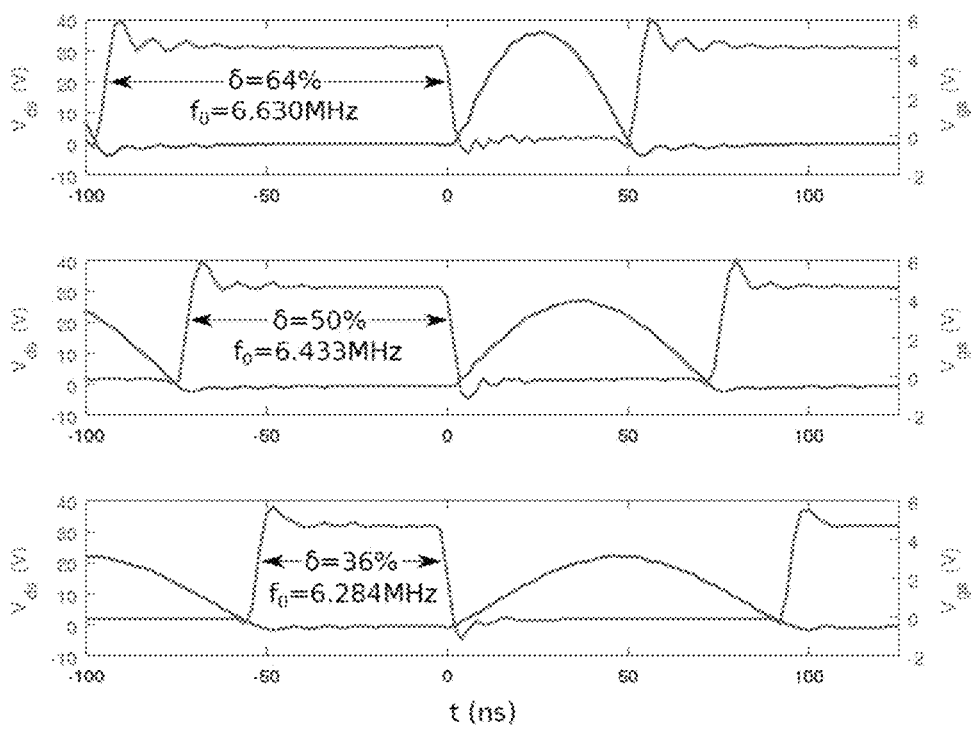
FIG. 20 is a chart showing measured gate and drain voltage waveforms for a Class-E amplifier with automatic zero-voltage switching for various tuning conditions according to various embodiments of the present disclosure.

However, when the resonator is detuned, the ratio of the RF current to the DC supply voltage changes. This can be seen in FIG. 20.

The tuning error of the LC resonator may be detected using the duty cycle of the AZVS Class-E RF generator. As long as the AZVS Class-E RF generator is operating under light loading conditions, the duty cycle will be a function primarily of the tuning of the LC resonator, and will have little dependence on the loading. The relation between the resonant frequency of the LC tank circuit $f_0$ 10 and the AZVS duty cycle $\delta$, is plotted in FIG. 14. Under light loading conditions, the relation between the resonant frequency $f_0$ and the AZVS duty cycle $\delta$, is given approximately by:

$$\frac{f_0}{f_d} \approx 1 - \frac{K}{2}\left(1 - \delta + \frac{\sin(2\pi\delta)}{2\pi}\right). \qquad \text{(eq. 27)}$$

Equation 22 is a valid approximation when K<<1 and under light loading conditions, defined as $I_{DC}<<I_{RF}$, where $I_{DC}$ and $I_{RF}$ are the DC and RF currents of the Class-E amplifier (see FIG. 18).

Under light loading conditions (i.e., $I_{DC}<<I_{RF}$), the RF current amplitude is a function of the AZVS duty cycle $\delta$.

$$I_{RF} = \frac{\pi V_{DC}}{X_s} \cdot \frac{1}{\sin(\pi\delta) + \pi(1-\delta)\cos(\pi\delta)}, \qquad \text{(eq. 28)}$$

where $X_1$ is the reactance of capacitor $C_1$. The AZVS duty cycle is a function of $f_0$. Therefore, the RF current amplitude will vary with $f_0$. For this reason, it is desirable to detect this detuning of the LC resonator and correct it using an active variable reactance.

The difference between the actual duty cycle of the AZVS Class-E RF generator and a certain reference value can be used as an error signal in a feedback loop to control the tuning of the LC resonator. The tuning range of the LC resonator with the active variable reactance should be chosen such that the RF current amplitude of the LC resonator driven by the AZVS Class-E RF generator is a monotonic function of the Reactance Control Input.

The feedback loop can then change the tuning of the LC resonator in order to make the actual duty cycle equal to the reference value. Once the duty cycle is fixed, the ratio of the RF current to the DC supply voltage will be fixed. This will keep the RF current amplitude substantially constant over a range of both tuning and loading conditions.

Figure 22:
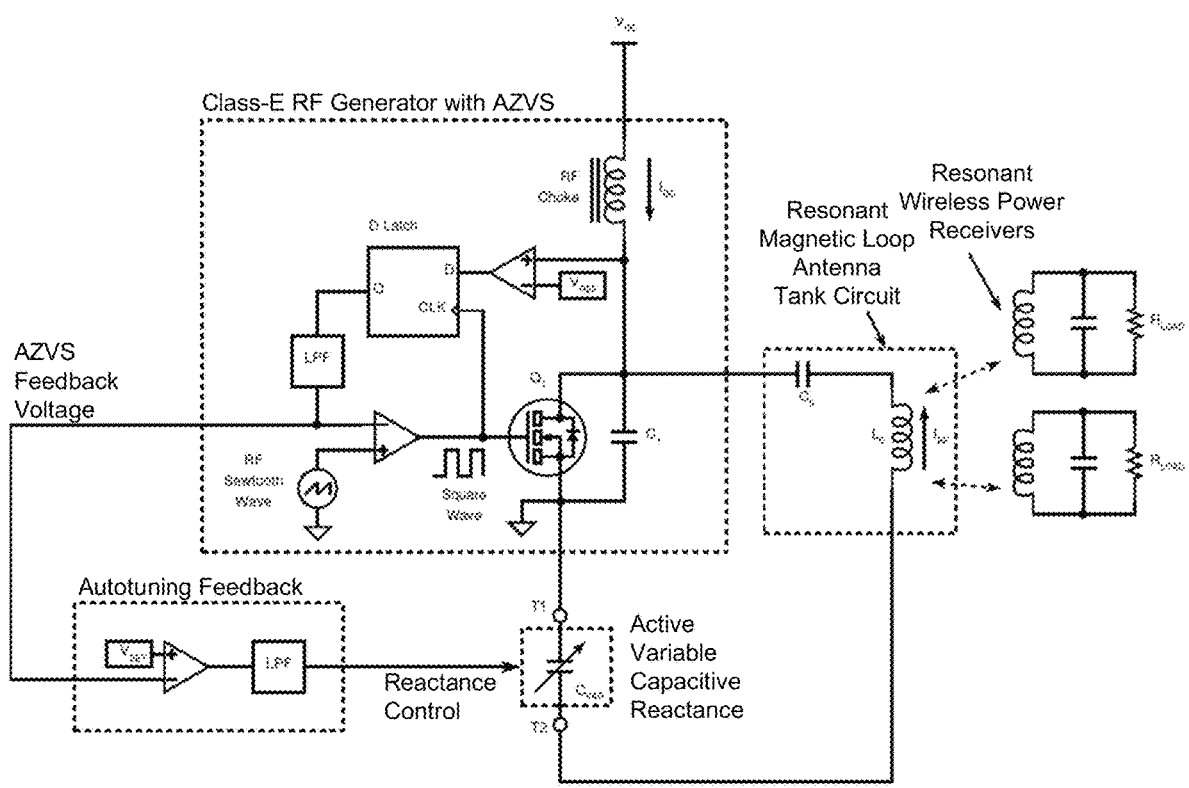
FIG. 22 is a schematic diagram of a Class-E RF generator with AZVS and autotuning according to various embodiments of the present disclosure.

FIG. 22 shows an example of how the autotuning may work. A Class-E RF Generator with AZVS is connected to an LC tank circuit 10 comprising a capacitor C0 and an inductor L0 in series with an active variable capacitive reactance. In this example, the Active Variable Capacitive Reactance gets its DC power from the same source as the Class-E RF Generator with AZVS. The resonant frequency of the tank circuit $f_0$ is given by:

$$f_0 = \frac{1}{2\pi\sqrt{L_0 C_{series}}}, \qquad \text{(eq. 29)}$$

where the total series capacitance is given by the relation:

$$\frac{1}{C_{series}} = \frac{1}{C_0} + \frac{1}{C_{VAR}}, \qquad \text{(eq. 30)}$$

where $C_{VAR}$ is the effective capacitance of the Active Variable Capacitive Reactance circuit.

The feedback loop works as follows. The effective capacitance, $C_{VAR}$, of the Active Variable Capacitive Reactance increases monotonically with an increase in its Reactance Control input. The series capacitance, $C_{series}$, increases monotonically with an increase in $C_{VAR}$. The resonant frequency $f_0$ decreases monotonically with an increase in $C_{series}$.

The duty cycle of the Class-E RF Generator with AZVS decreases monotonically with a decrease in $f_0$. The AZVS Feedback Voltage is proportional to 1−$\delta$. Therefore, the AZVS Feedback Voltage increases monotonically as decreases. The output of the Autotuning Feedback sub-circuit decreases monotonically as the AZVS Feedback Voltage increases. The output of the Autotuning Feedback sub-circuit is sent to the Reactance Control input of the Active Variable Capacitive Reactance, which completes the negative feedback loop.

The Autotuning Feedback sub-circuit compares the AZVS Feedback Voltage to a fixed voltage, VSET, and high DC gain of the negative feedback loop works to ensure that the AZVS Feedback Voltage is equal to VSET in equilibrium. Note that the circuit contains two feedback loops, one internal to the Class-E RF Generator with AZVS, as well as a larger loop which controls the tuning of the LC tank circuit 10. The cutoff frequency of the low-pass filter in the AZVS feedback loop should be chosen to be higher than the cutoff frequency of the low-pass filter in the Autotuning Feedback sub-circuit. This will ensure that the AZVS is always in an approximately steady-state condition relative to the time scale of the Autotuning Feedback system.

The circuit shown in FIG. 22 will automatically adjust the tuning of the LC tank circuit 10 in order to keep the duty cycle $\delta$ of the Class-E RF Generator with AZVS fixed.

Figure 13:
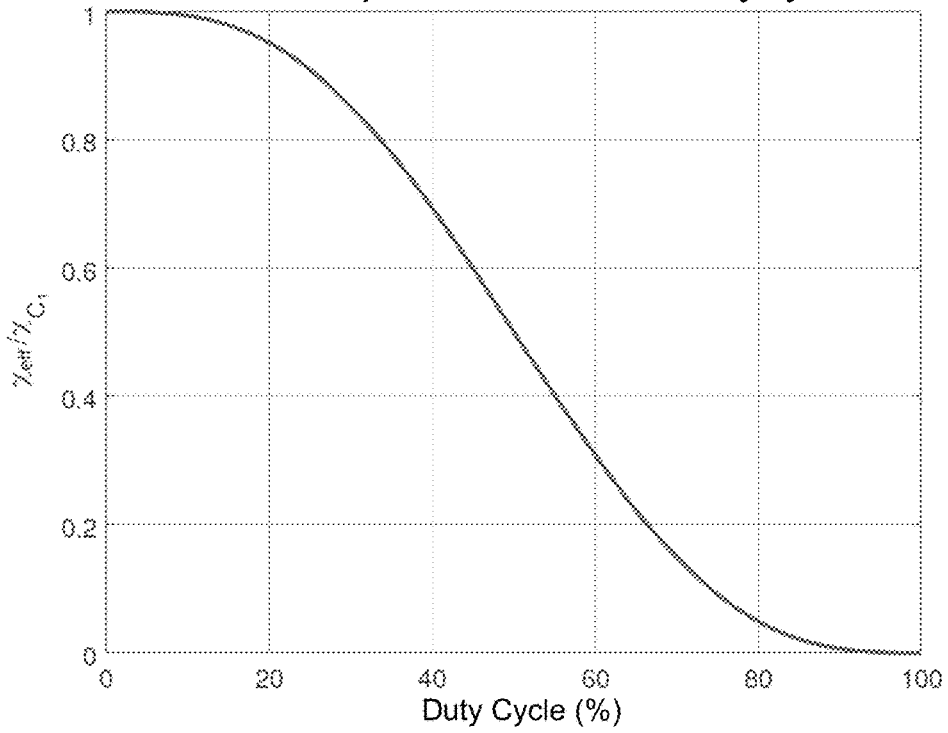
FIG. 13 is a graph showing an effective capacitive reactance as a function of duty cycle.

The duty cycle set point will be set by the voltage, VSET. As shown by FIGS. 13 and 12, the AZVS duty cycle is mainly a function of the resonant frequency $f_0$ and substantially independent of the load. Therefore, by fixing the AZVS duty cycle $\delta$ the tank circuit resonant frequency $f_0$ will also be fixed.

The autotuning will therefore make the system largely insensitive to variations in component values, or environmental perturbations which affect the inductance of L0. The system will therefore maintain a constant RF current amplitude in the LC tank circuit 10 under a variety of both tuning and loading conditions.

Note that it is also possible to eliminate the internal feedback loop in the Class-E RF Generator with AZVS, such that the MOSFET $Q_1$ is driven at a constant duty cycle. Instead of changing the duty cycle to maintain the ZVS condition, the Active Variable Capacitive Reactance may be used instead to vary the tuning of the LC tank circuit 10 until the ZVS condition is satisfied.

Figure 23:
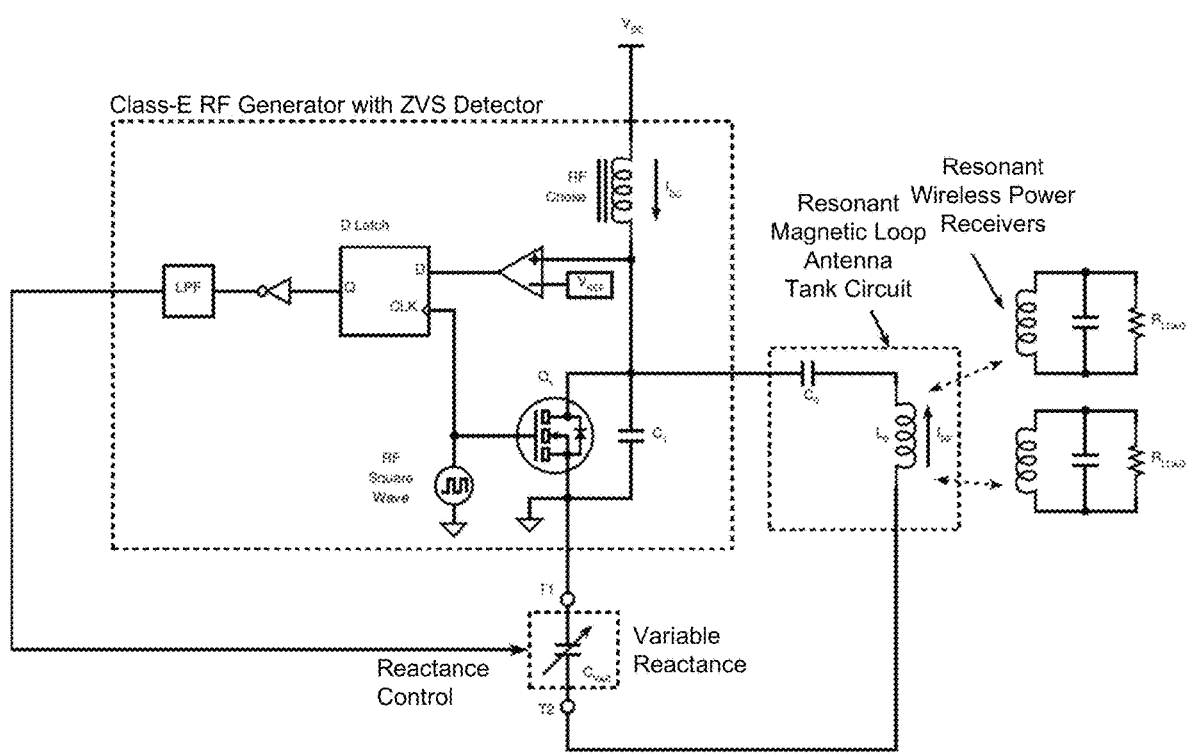
FIG. 23 is a schematic diagram of a Class-E RF generator that achieves ZVS via tuning using a variable reactance in series with an LC tank circuit according to various embodiments of the present disclosure.

FIG. 23 shows an example of how this may be achieved. A comparator and D-latch detect whether the drain voltage of $Q_1$ is above or below $V_{REF}$ when $Q_1$ turns on. If the drain voltage of $Q_1$ is above $V_{REF}$ when $Q_1$ switches on, the output of the D-latch will be high. This output goes through an inverter and a low-pass filter. If the output of the D-latch is high, the output of the inverter will be low, and the output of the low-pass filter will slowly fall, decreasing the Reactance Control input of the Variable Reactance.

As the Reactance Control input falls, the resonant frequency of the LC tank circuit 10 will rise, which will cause the drain voltage of $Q_1$ at the instant it turns on to decrease. This completes the feedback loop.

In the examples described in this section, the switching devices used were MOSFETs. However, any general switching device would work, so long as its switching speed is fast compared to the driving frequency. The LC tank circuit 10 was also tuned using an active variable capacitive reactance. However, any general active variable reactance, or combination of active variable reactances may be used, such as active variable inductances, or combinations of active variable inductances and capacitances.

Note that, in general, the active variable capacitive reactance shown in FIG. 22 and the variable reactance shown in FIG. 23 may be any kind of electrically-controllable variable reactances.

Figure 25:
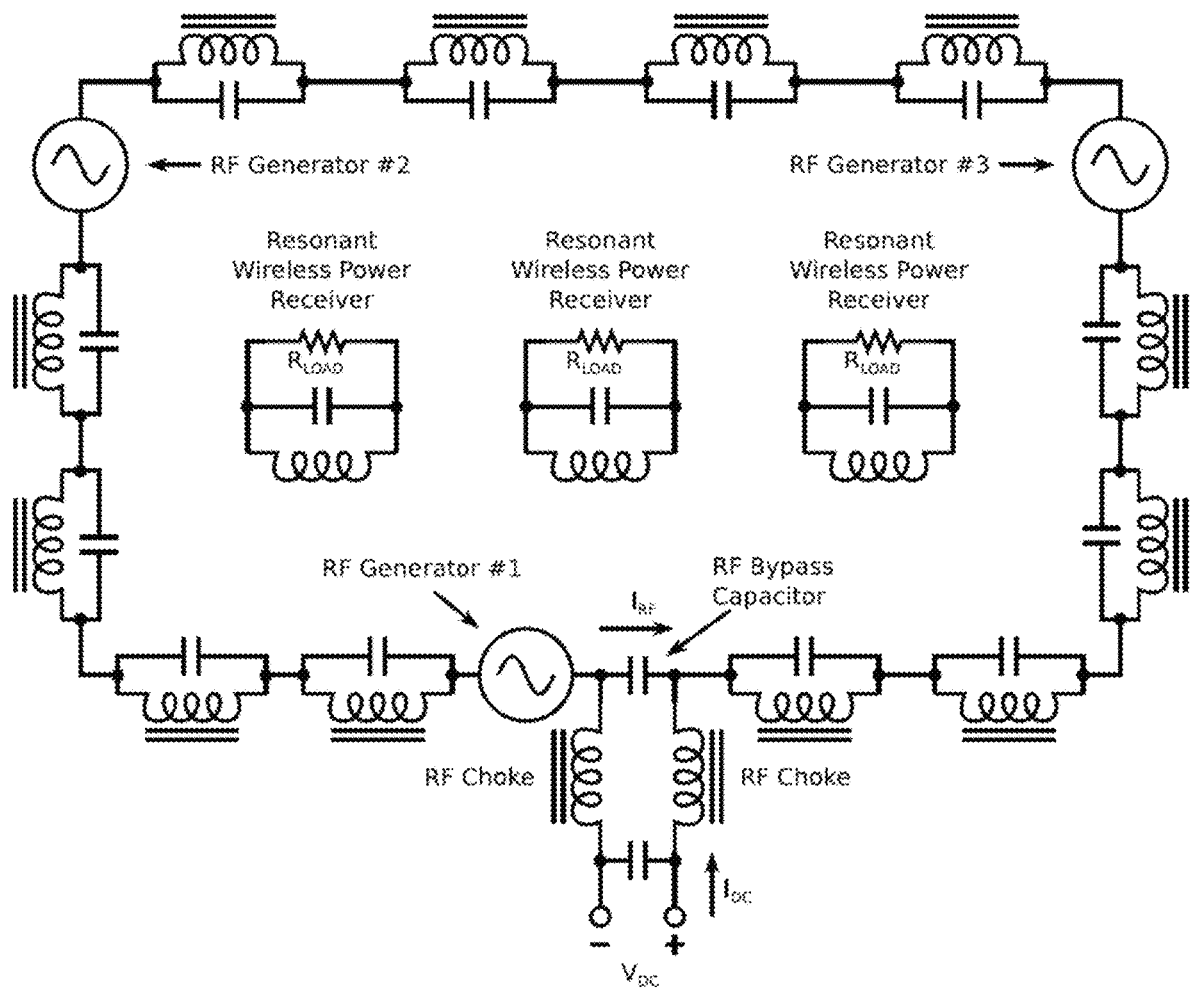
FIG. 25 is a simplified schematic diagram of a resonant magnetic loop antenna driven by distributed RF generators according to various embodiments of the present disclosure.

Tuning of a LC Resonator Driven by Distributed AZVS Class-E RF Generators. In some cases, it is desirable to drive a resonant magnetic loop antenna from multiple RF generators distributed in series around the loop. FIG. 25 shows an example of a loop with three distributed RF generators. The series capacitors in the loop are modified with the addition of parallel RF chokes, which allow DC current to bypass the capacitors. This allows a DC current to circulate around the loop in addition to the RF current, which enables the RF generators to take in DC power from the same two terminals which they use to output RF power.

Figure 24:
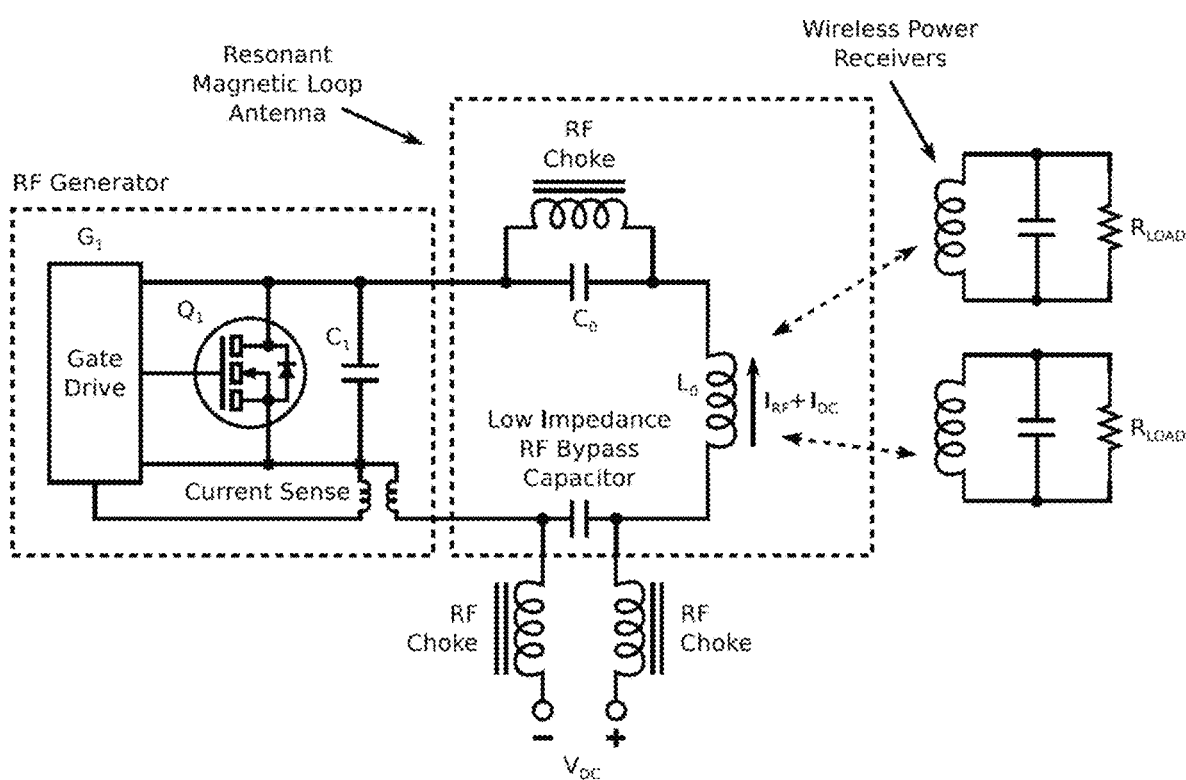
FIG. 24 is a schematic diagram of a Class-E amplifier rearranged so that the RF generator draws direct current (DC) power from the same two terminals it uses to output RF power according to various embodiments of the present disclosure.

FIG. 24 shows an example of how a Class-E RF generator may be modified so that it takes in DC power from the same two terminals that it uses to output RF power. It is also important that all RF generators be phase-locked, and FIG. 24 also illustrates an example of how this may be achieved. The RF generator contains a current-sensing transformer which picks up a signal proportional to the RF current circulating in the magnetic loop antenna. The gate-drive circuit generates a square wave which is phase-locked to this signal. Because all distributed RF generators are in series and share the same RF current, this phase-locking mechanism will guarantee that they will all have the same phase relative to each other.

Figure 26:
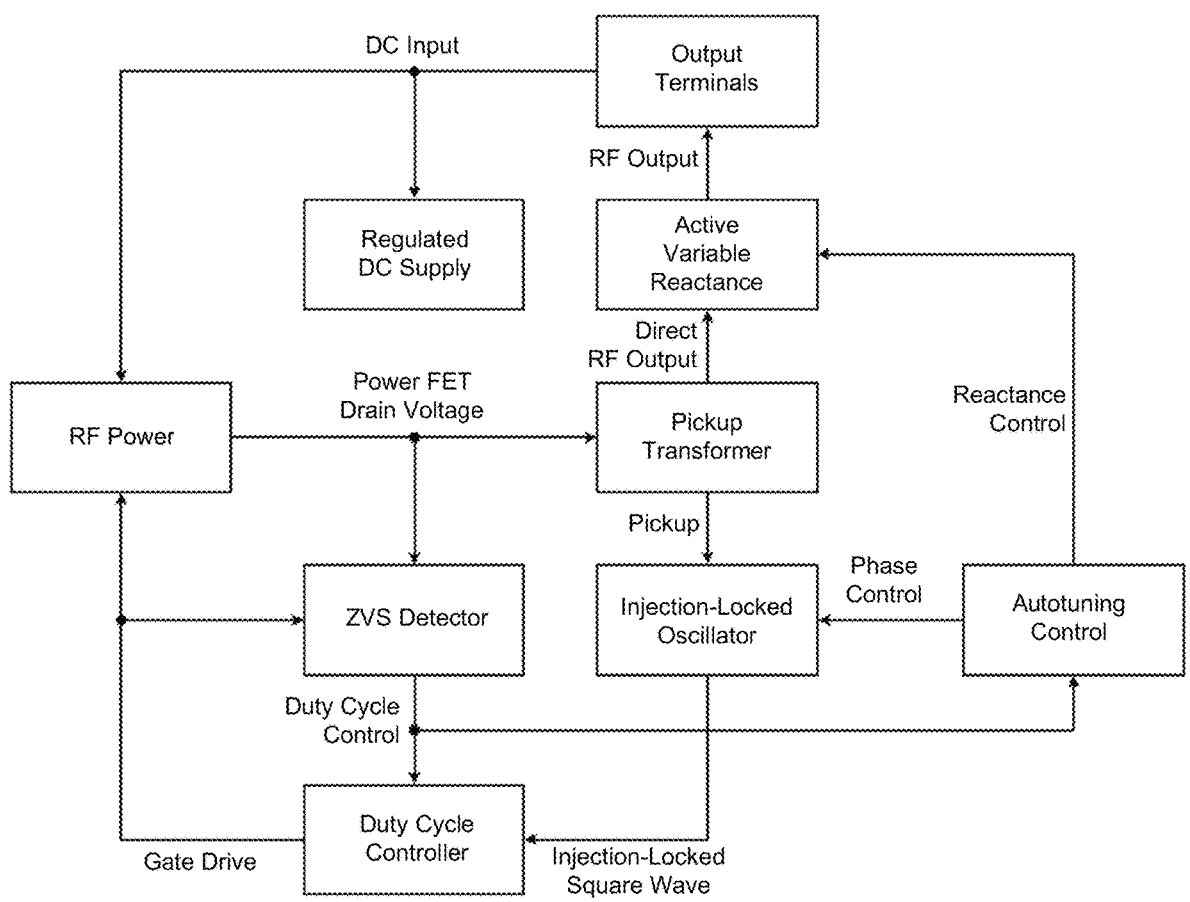
FIG. 26 is a schematic block diagram of an RF Generator for use as part of a distributed RF generator system with AZVS and autotuning according to various embodiments of the present disclosure.

As in the case of a magnetic loop antenna driven by a single RF generator, it may be desirable in some cases to use active variable reactance to tune the magnetic loop antenna driven by multiple, distributed RF generators. FIG. 26 shows how this may be accomplished through a modification of the RF generators. Specifically, FIG. 26 depicts a block diagram for a single RF generator for use in a distributed RF generator system with autotuning. As before, the output terminals serve a dual purpose: as an RF output and as a DC input. The DC input power goes to the RF Power sub-circuit and the Regulated DC Supply, which supplies a stable DC voltage to the rest of the circuit.

The RF Power sub-circuit contains a switching element, such as a MOSFET, which takes in a Gate Drive signal from the Duty Cycle Controller sub-circuit. RF power from the Power FET Drain Voltage is output through a Pickup Transformer, in series with an Active Variable Reactance, and sent to the Output Terminals.

The Power FET Drain Voltage is sensed by a ZVS Detector at the rising edge of the Gate Drive signal to detect if the Power FET Drain Voltage is above or below a certain Reference Voltage at the instant when the Power FET is switched on. This may be achieved using a D-latch and comparator, as shown in FIG. 18, for example. The Duty Cycle Control output of the ZVS Detector slowly rises with time if the rising edge of the Gate Drive signal occurs while the Power FET Drain Voltage is above the Reference Voltage.

The Duty Cycle Control output of the ZVS Detector slowly falls with time if the rising edge of the Gate Drive signal occurs while the Power FET Drain voltage is below the Reference Voltage. The characteristic timescale for the rising or falling of the Duty Cycle Control output is determined by the cutoff frequency of a low-pass filter inside the ZVS Detector sub-circuit.

The Duty Cycle Control output of the ZVS Detector goes to the Duty Cycle Controller sub-circuit. This sub-circuit takes in an Injection-Locked Square Wave, and outputs a Gate Drive square wave which has a duty cycle that monotonically decreases as the Duty Cycle Control signal increases. Note that the sign of the logic, and the sign of analog control signals, may be inverted without changing the overall behavior of the circuit, so long as the signs of the inputs and outputs of the sub-circuits to which those control signals connect are all inverted consistently.

The RF Power sub-circuit, ZVS Detector sub-circuit, and Duty Cycle Controller sub-circuit form a closed feedback loop which automatically adjusts the duty cycle of the Gate Drive square wave such that the RF Power sub-circuit always operates in a state of Zero-Voltage Switching.

The Injection-Locked Square Wave is output from an Injection-Locked Oscillator sub-circuit, which takes a sine-wave Pickup input from the secondary of a Pickup Transformer. The Injection-Locked Oscillator sub-circuit generates a square wave at the intended frequency of operation of the system, plus or minus a certain frequency tolerance. When a signal is present at the Pickup input, the Injection-Locked Oscillator locks its frequency to that of the Pickup input. There will be a small phase difference between the phase of the Injection-Locked Square Wave and the phase of the Pickup input, which will be proportional to the difference in frequency between signal present at the Pickup input and the natural frequency of the Injection-Locked Oscillator.

The primary of the Pickup Transformer is in series with the magnetic loop antenna in which the RF Generator is placed. Therefore, the Pickup signal is proportional to the RF current circulating in the magnetic loop antenna, which is shared by all of the series-connected RF Generators. By locking the frequency of the Injection-Locked Square Wave to the frequency of the RF current circulating in the magnetic loop antenna, all of the RF Generators are locked in frequency relative to each other. Each RF Generator will have a small phase difference relative to the average phase of all the distributed RF Generators due to the difference between the natural frequency of its Injection-Locked Oscillator and the average natural frequency of all the Injection-Locked Oscillators.

Figure 21:
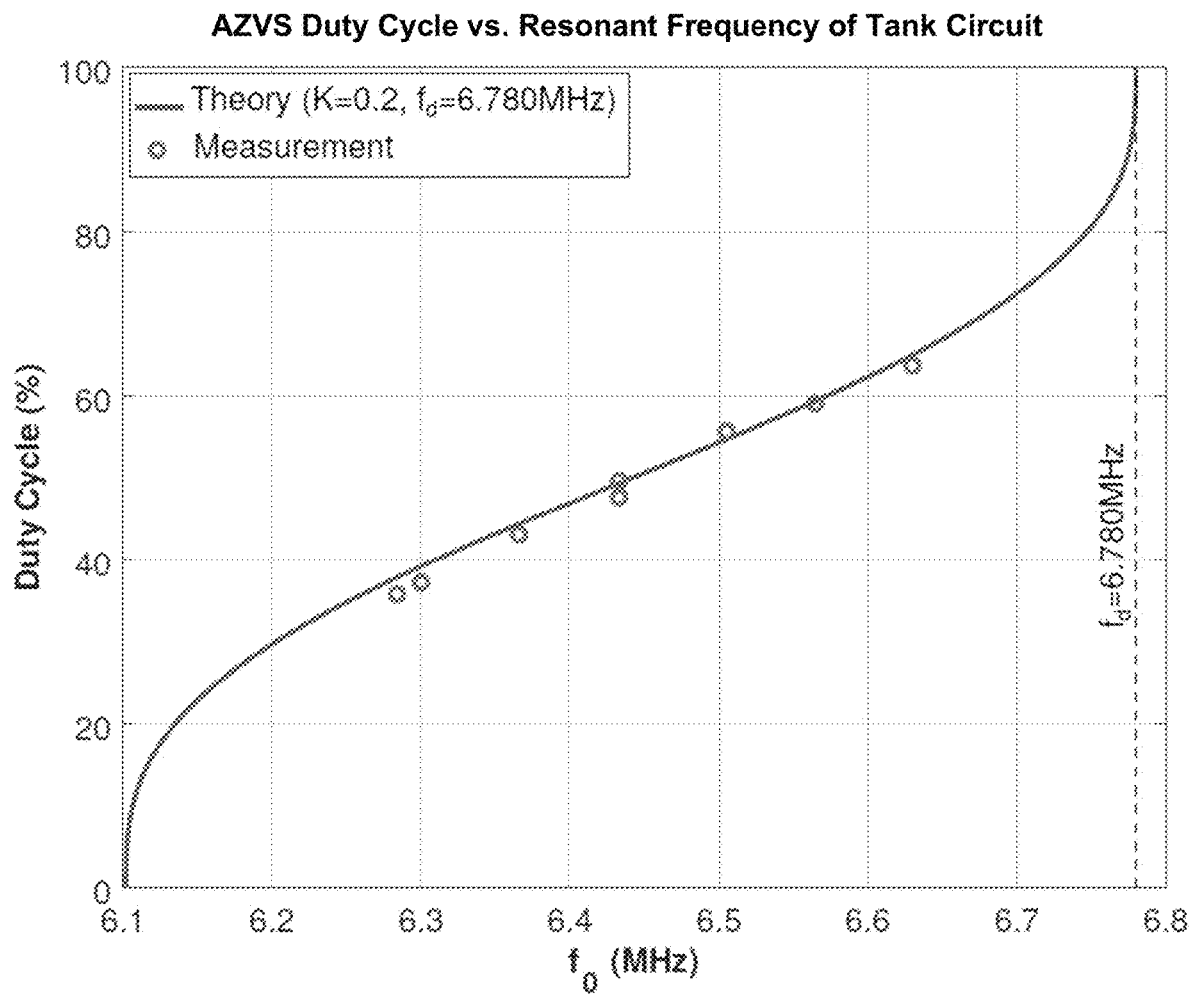
FIG. 21 is a chart showing a measured duty cycle of the AZVS amplifier as a function of resonant frequency of a tank circuit according to various embodiments of the present disclosure.

The phase differences between the RF Generators may be reduced by imposing tighter tolerances on the natural frequencies of the Injection-Locked Oscillators. When the AZVS feedback system has reached a steady state each RF Generator will have a duty cycle which depends on the overall tuning of the magnetic loop antenna. See FIG. 21 for an example of this relation for a single, Class-E RF generator. Therefore, the Duty Cycle Control signal in each RF Generator circuit may be used as a local measurement of the detuning of the entire loop, and the difference between the Duty Cycle Control signal and a desired set-point may be used as an error signal to control an Active Variable Reactance which will alter the tuning of the magnetic loop antenna.

It is often the case that the magnetic loop antenna may need to be tuned over a certain fractional tuning range, $\Delta f_0/f_d$, which is independent of the size of the loop, where $f_0$ is the range of resonant frequencies over which the loop must be tuned, and $f_d$ is the driving frequency of the loop. The resonant frequency of the magnetic loop antenna is:

$$f_0 = \frac{1}{2\pi\sqrt{L_0 C_0}}, \qquad (eq. 31)$$

where $L_0$ and $C_0$ are the total series inductance and capacitance of the magnetic loop antenna, respectively. The relation between $\Delta f_0$, $\Delta L_0$, and $\Delta C_0$ is:

$$\frac{\Delta f_0}{f_0} \approx -\frac{1}{2}\frac{\Delta L_0}{L_0} - \frac{1}{2}\frac{\Delta C_0}{C_0} \approx -\frac{1}{2}\frac{\Delta X_{L_0}}{X_{L_0}} + \frac{1}{2}\frac{\Delta X_{C_0}}{X_{C_0}}, \qquad (eq. 32)$$

where $X_{L_0}=2\pi f_d L_0$, and $X_{C_0}=1/(2\pi f_d C_0)$. The errors in the capacitive and inductive reactances of the magnetic loop antenna may be due to component tolerances or due to environmental effects. In either case, the fractional error will likely be independent of the size of the loop. Therefore, the absolute error of these reactances will grow with the size of the loop.

It is therefore desirable to add an active variable reactance in series with the loop which can be tuned to correct for these errors. However, the size of this correction factor grows with the size of the loop. It may therefore become impractical to use a single active variable reactance to retune the loop when the loop size is large.

A natural solution to this problem is to add an Active Variable Reactance to every RF generator, as shown in the block diagram in FIG. 26. Because the number of distributed RF Generators grows as the loop size grows, so too will the number of Active Variable Reactances in series with the loop. The total series reactance of all the Active Variable Reactances will therefore grow with the size of the loop, allowing a nearly constant fractional tuning range to be achieved for loops of varying size.

Because the Duty Cycle Control signal may be used in each RF Generator circuit as a local measurement of the detuning of the entire loop, it may be used to control an Active Variable Reactance sub-circuit within each RF Generator. The Autotuning Control sub-circuit forms a feedback loop which outputs a Reactance Control signal proportional to the difference between the Duty Cycle Control signal and a pre-defined duty cycle set-point. The gain of this feedback loop can be chosen such that it exhibits negative feedback. A low-pass filter should be added to this feedback loop, within the Autotuning Control sub-circuit, such that the AZVS feedback loop has time to stabilize in a steady state on a timescale much faster than the timescale of the autotuning feedback loop.

Note that the Autotuning Control sub-circuit should not have infinite gain at DC, since, as described above, there will be variations between all of the RF Generators which will cause them all to have small phase shifts relative to each other. Therefore, when the while magnetic loop antenna is tuned such that the average duty cycle of all of the RF Generators is equal to the desired duty cycle set point, each individual RF Generator will have a small phase shift which will cause its duty cycle to differ from the set-point by a small amount. If this difference was amplified with infinite gain by the Autotuning Control sub-circuit, the Active Variable Reactance sub-circuit would be saturated at either its highest or lowest reactance. The magnitude of the gain in the Autotuning Control sub-circuit should therefore be chosen such that the scale of the duty cycle error, multiplied by the gain factor, gives a Reactance Control output signal which is still within the range of values for which the Active Variable Reactance sub-circuit is responsive.

The phase error between RF Generator circuits may be corrected using a third feedback loop, which is designed to operate on a timescale slower than both the autotuning feedback loop and the AZVS feedback loop. When the autotuning feedback loop is in a steady state, the remaining difference between the Duty Cycle Control signal and the desired set-point will produce an error signal proportional to the phase error of that RF Generator, which is proportional to the error in its natural frequency. This error may be corrected using a Phase Control signal which is input to the Injection-Locked Oscillator sub-circuit. This Phase Control signal may be used to adjust the natural frequency and/or phase of the Injection-Locked Oscillator sub-circuit, and may be arranged to produce negative feedback, such that the difference between the Duty Cycle Control signal and the desired set point is driven toward zero.

This third feedback loop is optional, and may not be needed if the error in the natural frequencies of the Injection-Locked Oscillators are sufficiently small. However, it may be useful for making the system more tolerant of frequency errors in the Injection-Locked Oscillators, which may allow the use of less expensive components with larger tolerances.

While the disclosure has been described with respect to a limited number of embodiments, those skilled in the art, having benefit of this disclosure, will appreciate that other embodiments can be devised which do not depart from the scope of the disclosure as disclosed herein. Accordingly, the scope of the disclosure should be limited only by the attached claims.

The features, structures, or characteristics described above may be combined in one or more embodiments in any suitable manner, and the features discussed in the various embodiments are interchangeable, if possible. In the following description, numerous specific details are provided in order to fully understand the embodiments of the present disclosure. However, a person skilled in the art will appreciate that the technical solution of the present disclosure may be practiced without one or more of the specific details, or other methods, components, materials, and the like may be employed. In other instances, well-known structures, materials, or operations are not shown or described in detail to avoid obscuring aspects of the present disclosure.

Although the relative terms such as "on," "below," "upper," and "lower" are used in the specification to describe the relative relationship of one component to another component, these terms are used in this specification for convenience only, for example, as a direction in an example shown in the drawings. It should be understood that if the device is turned upside down, the "upper" component described above will become a "lower" component. When a structure is "on" another structure, it is possible that the structure is integrally formed on another structure, or that the structure is "directly" disposed on another structure, or that the structure is "indirectly" disposed on the other structure through other structures.

In this specification, the terms such as "a," "an," "the," and "said" are used to indicate the presence of one or more elements and components. The terms "comprise," "include," "have," "contain," and their variants are used to be open ended, and are meant to include additional elements, components, etc., in addition to the listed elements, components, etc. unless otherwise specified in the appended claims.

The terms "first," "second," "third," etc. in the description or claims are used only as labels, rather than a limitation for a number of the objects unless specified otherwise. It is understood that if multiple components are shown, the components may be referred to in the claims as a "first" component, a "second" component, a "third" component, and so forth, to the extent applicable.

The above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

Clause 1. A system, comprising: an active variable reactance circuit configured to control a resonant frequency of at least one resonant circuit, comprising: an electrically-controllable switching element; a passive reactive component connected to at least one terminal of the electrically-controllable switching element; and a switch controller sub-circuit configured to switch the electrically-controllable switching element at a frequency of a radio-frequency (RF) current or voltage passing through or across a device.

Clause 2. The system of clause 1, wherein the electrically-controllable switching element is one of: a metal-oxide-semiconductor field-effect transistor (MOSFET), a bipolar junction transistor (BJT), and a pair of MOSFETs arranged as a bidirectional switch.

Clause 3. The system of any of clauses 1-2, wherein: the passive reactive component provides a variable capacitive reactance that is in series with the at least one resonant circuit; or the passive reactive component provides a variable inductive reactance that is in parallel with the at least one resonant circuit.

Clause 4. The system of any of clauses 1-3, further comprising a current pickup device configured to generate a voltage proportional to the RF current and provide the voltage to the switch controller sub-circuit.

Clause 5. The system of any of clauses 1-4, wherein the current pickup device is one of: a transformer, a series resistance device, and a series reactance device.

Clause 6. The system of any of clause 1-5, wherein the switch controller sub-circuit is configured to receive an RF pickup signal in a form of a sine wave from the current pickup device as an input, and generate a square wave output signal having a variable duty cycle, the square wave output signal driving the electrically-controllable switching element.

Clause 7. The system of any of clauses 1-6, wherein the variable duty cycle is controlled by a reactance control input signal provided to the switch controller sub-circuit.

Clause 8. The system of any of clauses 1-7, wherein a phase of the square wave output signal leads the RF current by 90 degrees.

Clause 9. The system of any of clauses 1-8, wherein the at least one resonant circuit is a part of a resonant repeater that receives wireless power from a wireless power source and delivers power to a separate wireless power receiver.

Clause 10. The system of any of clauses 1-9, further comprising an automatic RF current regulator circuit configured to: identify a DC signal generated by the at least one resonant circuit that is proportional to the RF current flowing through the at least one resonant circuit; compare the DC signal to an internal set point using an RF amplitude comparison and reactance control circuit; and amplify an error between the RF amplitude signal the internal set point and transmit the error as amplified as a reactance control signal to an active variable reactance sub-circuit.

Clause 11. The system of any of clauses 1-10, further comprising the at least one resonant circuit.

Clause 12. The system of any of clauses 1-11, wherein the electrically-controllable switching element is a single electrically-controllable switching element of the active variable reactance circuit.

Clause 13. A system, comprising: an active variable reactance circuit configured to control a resonant frequency of at least one resonant circuit, comprising: an electrically-controllable switching element in parallel with at least one capacitor; and a switch controller sub-circuit configured to switch the electrically-controllable switching element at a frequency of a radio-frequency (RF) current or voltage passing through or across a device such that the RF current flowing from a first terminal to a second terminal is substantially sinusoidal.

Clause 14. A system, comprising: an active variable reactance circuit configured to control a resonant frequency of at least one resonant circuit, comprising: an electrically-controllable switching element in series with at least one inductor; and a switch controller sub-circuit configured to switch the electrically-controllable switching element at a frequency of a radio-frequency (RF) current or voltage passing through or across a device such that the RF voltage across a first terminal and a second terminal is substantially sinusoidal.

Clause 15. A method, comprising: controlling, by an active variable reactance circuit, a resonant frequency of at least one resonant circuit by: providing an electrically-controllable switching element; providing a passive reactive component connected to at least one terminal of the electrically-controllable switching element; and switching, by a switch controller sub-circuit, the electrically-controllable switching element at a frequency of a radio-frequency (RF) current or voltage passing through or across a device.

Clause 16. The method of clause 15, wherein the electrically-controllable switching element is one of: a metal-oxide-semiconductor field-effect transistor (MOSFET), a bipolar junction transistor (BJT), and a pair of MOSFETs arranged as a bidirectional switch.

Clause 17. The method of any of clauses 15-16, wherein: the switch controller provides a variable capacitive reactance that is in series with the resonant circuit; or the switch controller provides a variable inductive reactance that is in parallel with the resonant circuit.

Clause 18. The method of any of clauses 15-17, further comprising generating, by a current pickup device, a voltage proportional to the RF current and providing the voltage to the switch controller sub-circuit.

Clause 19. The method of any of clauses 15-18, wherein the current pickup device is one of: a transformer, a series resistance device, and a series reactance device.

Clause 20. The method of any of clauses 15-19, further comprising: receiving, by the switch controller sub-circuit, an RF pickup signal in a form of a sine wave from the current pickup device as an input; and generating, by the switch controller sub-circuit, a square wave output signal having a variable duty cycle, the square wave output signal; driving the electrically-controllable switching element using the square wave output signal.

Clause 21. The method of any of clauses 15-20, wherein the variable duty cycle is controlled by a reactance control input signal provided to the switch controller sub-circuit.

Clause 22. The method of any of clauses 15-21, wherein a phase of the square wave output signal leads the RF current by 90 degrees.

Clause 23. The method of any of clauses 15-22, wherein the at least one resonant circuit is a part of a resonant repeater that receives wireless power from a wireless power source and delivers power to a separate wireless power receiver.

Clause 24. The method of any of clauses 15-23, further comprising, using an automatic RF current regulator circuit: identifying a DC signal generated by the at least one resonant circuit that is proportional to the RF current flowing through the at least one resonant circuit; comparing the DC signal to an internal set point using an RF amplitude comparison and reactance control circuit; amplifying an error between the RF amplitude signal the internal set point; and transmitting the error as amplified as a reactance control signal to an active variable reactance sub-circuit.

Therefore, the following is claimed:

1. A system, comprising:
   an active variable reactance circuit, comprising:
      an electrically-controllable switching element;
      a passive reactive component connected to at least one terminal of the electrically-controllable switching element;
      a resonator connected to the at least one terminal of the electrically-controllable switching element;
      a radiofrequency (RF) pickup component configured to generate a pickup voltage proportional to an RF current or voltage passing through or across the resonator;
      a switch controller sub-circuit that receives the pickup voltage and a control voltage, and generates a switch control signal having a duty cycle based on the control voltage and a phase based on the pickup voltage that switches the electrically-controllable switching element at a frequency of the RF current or voltage passing through or across the resonator,
      wherein the switch controller sub-circuit comprises a comparator and an op-amp feedback loop, wherein the comparator receives the pickup voltage as a first input and a comparison voltage as a second input, the comparison voltage being an output of the op-amp feedback loop,
      wherein the op-amp feedback loop receives the switch control signal as a first input and the control voltage as a second input, and outputs the comparison voltage to the comparator.

2. The system of claim 1, wherein the electrically-controllable switching element is one of: a metal-oxide-semiconductor field-effect transistor (MOSFET), a bipolar junction transistor (BJT), and a pair of MOSFETs arranged as a bidirectional switch.

3. The system of claim 1, wherein:
   the passive reactive component provides a variable capacitive reactance that is in series with the resonator; or
   the passive reactive component provides a variable inductive reactance that is in parallel with the resonator.

4. The system of claim 1, wherein the op-amp feedback loop comprises:
   a first passive filter network;
   a second passive filter network;
   an op-amp having one input connected to the switch control voltage through the first passive filter network, and a second input connected to the control voltage and an op-amp output through the second passive filter network; and
   a third passive filter network that filters an output of the op-amp to generate the comparison voltage as input to the comparator.

5. The system of claim 4, wherein the RF pickup component is one of: a transformer, a series resistance device, and a series reactance device.

6. The system of claim 4, wherein the switch controller sub-circuit is configured to receive an RF pickup signal in a form of a sine wave from the RF pickup component as an input, and generate a square wave output signal having a variable duty cycle, the square wave output signal driving the electrically-controllable switching element.

7. The system of claim 6, wherein the variable duty cycle is controlled by a reactance control input signal provided to the switch controller sub-circuit.

8. The system of claim 6, wherein a phase of the square wave output signal leads the RF current by 90 degrees.

9. The system of claim 4, wherein:
   the op-amp feedback loop is a first op-amp feedback loop;
   the op-amp of the first op-amp feedback loop is a first op-amp; and
   the switch controller sub-circuit further comprises a second op-amp feedback loop comprising a second op-amp, wherein the second op-amp receives a reference voltage as a first input and a second voltage as a second input and outputs the control voltage, wherein the second voltage is a direct current (DC) voltage that is proportional to the RF current or voltage.

10. The system of claim 1, wherein the resonator is a part of a resonant repeater that receives wireless power from a wireless power source and delivers power to a separate wireless power receiver.

11. The system of claim 1, further comprising an automatic RF current regulator circuit configured to:
    identify a DC signal generated by the resonator that is proportional to the RF current flowing through the resonator;
    compare the DC signal to an internal set point using an RF amplitude comparison and reactance control circuit; and amplify an error between the RF amplitude signal the internal set point and transmit the error as amplified as a reactance control signal to an active variable reactance sub-circuit.

12. The system of claim 1, wherein the electrically-controllable switching element is a single electrically-controllable switching element of the active variable reactance circuit.

13. A method, comprising:
controlling, by an active variable reactance circuit, a resonant frequency of at least one resonant circuit by:
providing an electrically-controllable switching element;
providing a passive reactive component connected to at least one terminal of the electrically-controllable switching element, and a resonator connected to the at least one terminal of the electrically-controllable switching element;
generating, by a radiofrequency (RF) pickup component, a pickup voltage proportional to an RF current or voltage passing through or across the resonator;
receiving, by a switch controller sub-circuit, the pickup voltage and a control voltage, and generating, by the switch controller sub-circuit, a switch control signal having a duty cycle based on the control voltage and a phase based on the pickup voltage that switches the electrically-controllable switching element at a frequency of the RF current or voltage passing through or across the resonator, wherein the switch controller sub-circuit comprises a comparator and an op-amp feedback loop;
receiving, by the comparator, the pickup voltage as a first input and a comparison voltage as a second input, the comparison voltage being an output of the op-amp feedback loop; and
receiving, by the op-amp feedback loop, the switch control signal as a first input and the control voltage as a second input, and providing, by the op-amp feedback loop, the comparison voltage to the comparator.

14. The method of claim 13, wherein the electrically-controllable switching element is one of: a metal-oxide-semiconductor field-effect transistor (MOSFET), a bipolar junction transistor (BJT), and a pair of MOSFETs arranged as a bidirectional switch.

15. The method of claim 13, wherein:
the switch controller sub-circuit provides a variable capacitive reactance that is in series with the resonant circuit; or
the switch controller provides a variable inductive reactance that is in parallel with the resonant circuit.

16. The method of claim 13, wherein the op-amp feedback loop as provided comprises:
a first passive filter network;
a second passive filter network;
an op-amp having one input connected to the switch control voltage through the first passive filter network, and a second input connected to the control voltage and an op-amp output through the second passive filter network; and
a third passive filter network that filters an output of the op-amp to generate the comparison voltage as input to the comparator.

17. The method of claim 16, wherein the RF pickup component is one of: a transformer, a series resistance device, and a series reactance device.

18. The method of claim 17, wherein:
the op-amp feedback loop is a first op-amp feedback loop;
the op-amp of the first op-amp feedback loop is a first op-amp; and
the switch controller sub-circuit further comprises a second op-amp feedback loop comprising a second op-amp, wherein the second op-amp receives a reference voltage as a first input and a second voltage as a second input and outputs the control voltage, wherein the second voltage is a direct current (DC) voltage that is proportional to the RF current or voltage.

19. The method of claim 16, further comprising:
receiving, by the switch controller sub-circuit, an RF pickup signal in a form of a sine wave from the RF pickup component as an input; and
generating, by the switch controller sub-circuit, a square wave output signal having a variable duty cycle, the square wave output signal;
driving the electrically-controllable switching element using the square wave output signal.

20. The method of claim 19, wherein the variable duty cycle is controlled by a reactance control input signal provided to the switch controller sub-circuit.

21. The method of claim 19, wherein a phase of the square wave output signal leads the RF current by 90 degrees.

22. The method of claim 13, wherein the at least one resonant circuit is a part of a resonant repeater that receives wireless power from a wireless power source and delivers power to a separate wireless power receiver.

23. The method of claim 13, further comprising, using an automatic RF current regulator circuit:
identifying a DC signal generated by the at least one resonant circuit that is proportional to the RF current flowing through the at least one resonant circuit;
comparing the DC signal to an internal set point using an RF amplitude comparison and reactance control circuit;
amplifying an error between the RF amplitude signal the internal set point; and
transmitting the error as amplified as a reactance control signal to an active variable reactance sub-circuit.

* * * * *